(12) United States Patent
Kanbara et al.

(10) Patent No.: US 8,298,754 B2
(45) Date of Patent: Oct. 30, 2012

(54) METHOD FOR FORMING THICK FILM PATTERN, METHOD FOR MANUFACTURING ELECTRONIC COMPONENT, AND PHOTOLITHOGRAPHY PHOTOSENSITIVE PASTE

(75) Inventors: Hiroyuki Kanbara, Yasu (JP); Shuuichi Towata, Moriyama (JP); Michiaki Iha, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/596,000

(22) PCT Filed: Oct. 21, 2004

(86) PCT No.: PCT/JP2004/015621
§ 371 (c)(1),
(2), (4) Date: Jan. 17, 2007

(87) PCT Pub. No.: WO2005/052691
PCT Pub. Date: Sep. 6, 2005

(65) Prior Publication Data
US 2007/0224534 A1    Sep. 27, 2007

(30) Foreign Application Priority Data
Nov. 25, 2003  (JP) ................................. 2003-393551

(51) Int. Cl.
G03F 7/027    (2006.01)
G03F 7/26     (2006.01)
G03F 7/30     (2006.01)

(52) U.S. Cl. .................................... 430/322; 430/281.1

(58) Field of Classification Search ............... 430/270.1, 430/322, 330, 281.1, 329
See application file for complete search history.

(56) References Cited

U.S. PATENT DOCUMENTS

| 3,661,576 | A | * | 5/1972 | Crary ........................ 430/288.1 |
| 4,557,995 | A | * | 12/1985 | Broers et al. .................. 430/296 |
| 4,598,037 | A | * | 7/1986 | Felten ........................ 430/281.1 |
| 5,234,970 | A | * | 8/1993 | Kyle ............................... 522/96 |
| 5,648,196 | A | * | 7/1997 | Frechet et al. ............. 430/270.1 |
| 6,197,480 | B1 | * | 3/2001 | Iguchi et al. ................ 430/286.1 |
| 6,531,257 | B2 | * | 3/2003 | Kubota ........................ 430/198 |
| 2002/0013017 | A1 | | 1/2002 | Iha |
| 2002/0160313 | A1 | * | 10/2002 | Park et al. ...................... 430/321 |
| 2002/0164542 | A1 | * | 11/2002 | Oshio et al. ................. 430/270.1 |
| 2002/0177074 | A1 | * | 11/2002 | Hoshi et al. ................. 430/281.1 |
| 2003/0036020 | A1 | * | 2/2003 | Kubota ......................... 430/313 |
| 2004/0170925 | A1 | * | 9/2004 | Roach et al. ................ 430/281.1 |

FOREIGN PATENT DOCUMENTS

| EP | 0 775 940 | A1 | 5/1997 |
| JP | 02-268870 | A | 11/1990 |
| JP | 05-067405 | A | 3/1993 |
| JP | 05-204151 | * | 8/1993 |
| JP | 06-104569 | A | 4/1994 |
| JP | 07-135386 | A | 5/1995 |
| JP | 07-152153 | A | 6/1995 |
| JP | 09-218508 | A | 8/1997 |
| JP | 09-230587 | A | 9/1997 |
| JP | 09-304922 | A | 11/1997 |
| JP | 09-329892 | A | 12/1997 |
| JP | 11-316456 | A | 11/1999 |
| JP | 2000-056454 | A | 2/2000 |
| JP | 2001-40021 | A | 2/2001 |
| JP | 2001-092118 | A | 4/2001 |
| JP | 2001-358466 | A | 12/2001 |
| JP | 2002-082449 | A | 3/2002 |
| JP | 2002-214772 | A | 7/2002 |
| JP | 2002-270036 | A | 9/2002 |
| WO | WO 01/95361 | * | 12/2001 |

OTHER PUBLICATIONS

Machine translation of JP 2002-270036 published on Sep. 20, 2002.*
Machine translation of JP 2001-40021 published on Feb. 13, 2001.*
International Search Report issued in corresponding International Patent Application No. PCT/JP2004/015621 mailed Jan. 25, 2005.
Official Communication issued in corresponding Japanese Patent Application No. 2005-515745, drafted on Jul. 2, 2008.

* cited by examiner

Primary Examiner — Anca Eoff
(74) Attorney, Agent, or Firm — Keating & Bennett, LLP

(57) ABSTRACT

A method for forming a thick film pattern forms a thick film pattern having a large thickness, a high hardness, and a high aspect ratio and exhibiting high dimension precision and high shape precision. In the method, a photosensitive paste including an inorganic powder, a photosensitive monomer, and a photopolymerization initiator and containing substantially no polymer is applied to a support so as to form a photosensitive paste film. The resulting photosensitive paste film is subjected to an exposure treatment and, thereafter, development is conducted so as to form a predetermined thick film pattern. Alternatively, a photolithography photosensitive paste including an inorganic powder, a photosensitive monomer, a photopolymerization initiator, and a polymer is used, wherein a ratio (weight ratio) of the photosensitive monomer to a total amount of the photosensitive monomer and the polymer is about 0.86 or more.

8 Claims, 5 Drawing Sheets

METHOD FOR FORMING THICK FILM PATTERN, METHOD FOR MANUFACTURING ELECTRONIC COMPONENT, AND PHOTOLITHOGRAPHY PHOTOSENSITIVE PASTE

BACKGROUND OF THE INVENTION

1. Field of the Invention

The present invention relates to a method for forming a thick film pattern by using photolithography, a method for manufacturing an electronic component, and a photolithography photosensitive paste to be used for forming a thick film pattern via photolithography.

2. Description of the Related Art

As densities have been increased and signal speeds have been increased for high-frequency electronic apparatuses, patterns, e.g., wiring conductors, constituting high-frequency circuits provided in these apparatuses have been required to be fine, have large film thicknesses, have rectangular cross-sectional shapes, and furthermore, have wiring precision with very narrow ranges of variations in wiring dimensions.

A method for forming a pattern via photolithography has been widely used as a method for forming such a fine pattern. For example, a photosensitive paste containing an inorganic powder, a photosensitive monomer, a polymer, a photopolymerization initiator, and the like has been proposed and known as the photosensitive paste to be used therein (for example, Japanese Unexamined Patent Application Publication No. 2002-82449).

However, in the case where patterns are formed via photolithography, known photosensitive pastes have a problem in that an adequate photo-curing depth (a depth from a thick film surface, at which the energy of radiated light, e.g., ultraviolet light, travelling in the thick film falls below the minimum energy required for curing a resin due to attenuation by being consumed for curing the resin or being absorbed by the resin component) cannot be ensured.

The inventors of the present invention found that the polymer exerted an influence on this photo-curing depth. The reasons for this are believed to be that (a) the radiated light is refracted and scattered by the polymer and, therefore, it becomes difficult for the ultraviolet light to reach the inside of the photosensitive paste, (b) the ultraviolet light is absorbed by the polymer, and (c) when the polymer is contained, the micro-Brownian motion of the monomer in the photosensitive paste is hindered and, thereby, the polymerization becomes hard to proceed.

SUMMARY OF THE INVENTION

In order to overcome the above-described problems, preferred embodiments of the present invention provide a method for forming a thick film pattern, the method being capable of efficiently forming via photolithography a thick film pattern having a large thickness and exhibiting high dimension precision and high shape precision, a method for manufacturing an electronic component by using the thick film pattern, and a photolithography photosensitive paste suitable for being used therefor.

A method for forming a thick film pattern according to a preferred embodiment of the present invention includes the steps of applying to a support a photosensitive paste including an inorganic powder, a photosensitive monomer, and a photopolymerization initiator and containing substantially no polymer so as to form a photosensitive paste film, subjecting the photosensitive paste film to an exposure treatment, and developing the photosensitive paste film subjected to the exposure treatment so as to form a predetermined thick film pattern.

A method for forming a thick film pattern according to another preferred embodiment of the present invention includes the steps of applying to a support a photosensitive paste including an inorganic powder, a photosensitive monomer, a photopolymerization initiator, and a polymer, wherein a ratio (weight ratio) of the photosensitive monomer to a total amount of the photosensitive monomer and the polymer satisfies the condition represented by the following Formula (1):

$$\text{photosensitive monomer}/(\text{photosensitive monomer} + \text{polymer}) \geq 0.86 \quad (1)$$

so as to form a photosensitive paste film, subjecting the photosensitive paste film to an exposure treatment, and developing the photosensitive paste film subjected to the above-described exposure treatment so as to form a predetermined thick film pattern.

A method for forming a thick film pattern according to another preferred embodiment of the present invention is characterized in that the contents of the inorganic powder, the photosensitive monomer, and the photopolymerization initiator constituting the photosensitive paste are within the following ranges:
inorganic powder: about 60 to about 90 percent by weight,
photosensitive monomer: about 5 to about 39 percent by weight, and
photopolymerization initiator: about 1 to about 10 percent by weight.

A method for forming a thick film pattern according to another preferred embodiment of the present invention is characterized in that a photosensitive paste containing a photosensitive monomer having a double bond concentration within the range of about 8 mmol/g to about 11 mmol/g is preferably used as the photosensitive paste.

A method for forming a thick film pattern according to a further preferred embodiment of the present invention is characterized in that a photosensitive paste including a photosensitive monomer having an ethylene oxide structure with a degree of polymerization of about 3 or less is preferably used as the photosensitive paste.

A method for forming a thick film pattern according to a further preferred embodiment of the present invention is characterized in that the photosensitive paste includes an ultraviolet absorber.

A method for forming a thick film pattern according to another preferred embodiment of the present invention is characterized in that the photosensitive paste includes a solvent in a proportion of about 5 percent by weight or less.

A method for forming a thick film pattern according to a further preferred embodiment of the present invention is characterized in that development is conducted by using an organic solvent in the development step.

A method for forming a thick film pattern according to a further preferred embodiment of the present invention is characterized in that the exposure treatment is conducted while the photosensitive paste film and a photomask are arranged so as to be kept from contacting with each other in the exposure step.

A method for forming a thick film pattern according to a further preferred embodiment of the present invention is characterized in that the photosensitive paste is subjected to the exposure treatment without using a photomask in the exposure step.

A method for manufacturing an electronic component according to a preferred embodiment of the present invention includes the steps of forming a thick film pattern by the method according to any one of the above-described preferred embodiments, and then firing the thick film pattern.

A photolithography photosensitive paste according to a preferred embodiment of the present invention is characterized by including an inorganic powder, a photosensitive monomer, and a photopolymerization initiator and containing substantially no polymer.

A photolithography photosensitive paste according to a preferred embodiment of the present invention includes an inorganic powder, a photosensitive monomer, a photopolymerization initiator, and a polymer, wherein a ratio (weight ratio) of the photosensitive monomer to a total amount of the photosensitive monomer and the polymer satisfies the condition represented by the following Formula (1):

$$\text{photosensitive monomer}/(\text{photosensitive monomer}+\text{polymer}) \geqq 0.86 \quad (1).$$

A photolithography photosensitive paste according to a further preferred embodiment of the present invention is characterized in that the contents of the inorganic powder, the photosensitive monomer, and the photopolymerization initiator are within the following ranges:
  inorganic powder: about 60 to about 90 percent by weight,
  photosensitive monomer: about 5 to about 39 percent by weight, and
  photopolymerization initiator: about 1 to about 10 percent by weight.

A photolithography photosensitive paste according to a further preferred embodiment of the present invention is characterized in that the photosensitive monomer is a photosensitive monomer having a double bond concentration within the range of about 8 mmol/g to about 11 mmol/g.

A photolithography photosensitive paste according to a further preferred embodiment of the present invention is characterized in that the photosensitive monomer is a photosensitive monomer having an ethylene oxide structure with a degree of polymerization of about 3 or less.

A photolithography photosensitive paste according to a further preferred embodiment of the present invention is characterized by including an ultraviolet absorber.

A photolithography photosensitive paste according to a further preferred embodiment of the present invention is characterized by including a solvent in a proportion of about 5 percent by weight or less.

In the method for forming a thick film pattern according to a preferred embodiment of the present invention, the photosensitive paste including the inorganic powder, the photosensitive monomer, and the photopolymerization initiator and containing substantially no polymer is applied to the support so as to form the photosensitive paste film, the resulting photosensitive paste film is subjected to the exposure treatment, and thereafter, the development is conducted so as to form a predetermined thick film pattern. Therefore, it becomes possible to efficiently form a thick film pattern having a large thickness and exhibiting high dimension precision and high shape precision.

That is, since the photosensitive paste containing substantially no polymer is used, in the exposure step, refraction, scattering, absorption, and the like of the radiated light by the polymer do not occur, the ultraviolet light easily reaches the inside of the photosensitive paste film, the micro-Brownian motion of the photosensitive monomer is not hindered by the polymer, and the polymerization is prevented from becoming hard to proceed. Consequently, it becomes possible to form a thick film pattern having a large thickness, a high hardness, and a high aspect ratio and exhibiting high dimension precision and high shape precision.

In various preferred embodiments of the present invention, that a photosensitive paste "contains substantially no polymer" means that the present invention includes the case where a very small amount of polymer is contained as an impurity in a photosensitive paste.

In the case where the photosensitive paste containing the polymer is used as in the method for forming a thick film pattern according to a preferred embodiment of the present invention as well, when a ratio (weight ratio) of the photosensitive monomer to a total amount of the photosensitive monomer and the polymer satisfies the condition represented by photosensitive monomer/(photosensitive monomer+polymer)$\geqq$0.86, that is, when the ratio of the polymer to the total amount of the photosensitive monomer and the polymer is less than about 0.14 on a weight ratio basis (less than about 14 percent by weight), in the exposure step, refraction, scattering, absorption, and the like of the radiated light by the polymer can be reduced, the ultraviolet light easily reaches the inside of the photosensitive paste film, and the micro-Brownian motion of the photosensitive monomer is prevented from being hindered by the polymer. Consequently, it becomes possible to form reliably a thick film pattern having a large thickness and exhibiting high dimension precision and high shape precision.

When the contents of the inorganic powder, the photosensitive monomer, and the photopolymerization initiator constituting the photosensitive paste are specified to be within the following ranges:
  inorganic powder: about 60 to about 90 percent by weight,
  photosensitive monomer: about 5 to about 39 percent by weight, and
  photopolymerization initiator: about 1 to about 10 percent by weight
the value of photo-curing depth of the photosensitive paste can be increased. Consequently, it becomes possible to efficiently form a thick film pattern having a large thickness and exhibiting high dimension precision and high shape precision by using the photosensitive paste.

When the photosensitive paste containing a photosensitive monomer having a double bond concentration within the range of about 8 mmol/g to about 11 mmol/g is used as the photosensitive paste, it becomes possible to increase the photo-curing depth and, therefore, the present invention is allowed to become more effective.

When the photosensitive paste containing a photosensitive monomer having an ethylene oxide structure with a degree of polymerization of about 3 or less is used as the photosensitive paste, it becomes possible to increase the value of photo-curing depth. This is preferable.

When the photosensitive paste including an ultraviolet absorber is used, it becomes possible to achieve a deeper photo-curing depth by a small amount of exposure and, therefore, a thick film pattern having a large thickness and exhibiting high dimension precision and high shape precision can be formed efficiently.

When the photosensitive paste including a solvent in a proportion of about 5 percent by weight or less is used, a drying step is allowed to become unnecessary or the drying step is allowed to be simplified and, therefore, the present invention is allowed to become more effective.

When the development is conducted by using the organic solvent in the development step, impurities do not enter the pattern, and a rinse step is allowed to become unnecessary or the rinse step is allowed to be simplified. Therefore, the development can easily and speedily be conducted and the present invention is allowed to become more effective.

When the exposure treatment is conducted while the photosensitive paste film and the photomask are disposed in such a way as to be kept from contacting with each other in the exposure step, the photosensitive paste film is prevented from being damaged due to contact with the photomask. Therefore, it becomes possible to form a highly reliable thick film pattern.

When the photosensitive paste is subjected to the exposure treatment without using a photomask in the exposure step, the photomask becomes unnecessary. Consequently, the cost can be reduced, the manufacturing step is allowed to be simplified and, therefore, the present invention is allowed to become more effective.

In the method for manufacturing an electronic component according to one of the preferred embodiments of the present invention, after the thick film pattern is formed by the method according to any one of the other preferred embodiments of the present invention, the resulting thick film pattern is fired. Consequently, it becomes possible to produce efficiently and reliably a high-performance, highly reliable electronic component provided with a fine pattern.

The photolithography photosensitive paste according to a preferred embodiment of the present invention includes the inorganic powder, the photosensitive monomer, and the photopolymerization initiator and contains substantially no polymer. Consequently, in the exposure step, since refraction, scattering, absorption, and the like of the radiated light by the polymer do not occur, the ultraviolet light easily reaches the inside of the photosensitive paste film, the micro-Brownian motion of the photosensitive monomer is not hindered by the polymer, and the polymerization tends to proceed. Therefore, it becomes possible to reliably form a thick film pattern exhibiting high dimension precision and high shape precision by using the photolithography photosensitive paste according to the present invention.

In the case where the polymer is included, when the ratio (weight ratio) of the photosensitive monomer to a total amount of the photosensitive monomer and the polymer satisfies the condition represented by photosensitive monomer/(photosensitive monomer+polymer)≧0.86, that is, when the ratio of the polymer to the total amount of the photosensitive monomer and the polymer is less than about 0.14 on a weight ratio basis (less than about 14 percent by weight), in the exposure step, refraction, scattering, absorption, and the like of the radiated light by the polymer can be reduced, the ultraviolet light easily reaches the inside of the photolithography photosensitive paste film, and the micro-Brownian motion of the photosensitive monomer is prevented from being hindered by the polymer. Consequently, it becomes possible to reliably form a thick film pattern having a large thickness and exhibiting high dimension precision and high shape precision.

When the contents of the inorganic powder, the photosensitive monomer, and the photopolymerization initiator constituting the photolithography photosensitive paste are within the following ranges:

inorganic powder: about 60 to about 90 percent by weight, photosensitive monomer: about 5 to about 39 percent by weight, and photopolymerization initiator: about 1 to about 10 percent by weight, a photolithography photosensitive paste having a large value of photo-curing depth can be produced. Consequently, it becomes possible to form efficiently a thick film pattern having a large thickness and exhibiting high dimension precision and high shape precision by using the photolithography photosensitive paste.

When the photolithography photosensitive paste contains the photosensitive monomer having a double bond concentration within the range of about 8 mmol/g to about 11 mmol/g as the photosensitive monomer, it becomes possible to increase the photo-curing depth and, therefore, the present invention is allowed to become more effective.

When the photolithography photosensitive paste includes the photosensitive monomer having an ethylene oxide structure with a degree of polymerization of about 3 or less as the photosensitive paste, it becomes possible to increase the value of photo-curing depth particularly and, therefore, the present invention is allowed to become more effective.

When the photolithography photosensitive paste includes an ultraviolet absorber, it becomes possible to achieve a deeper photo-curing depth by a small amount of exposure and, therefore, a thick film pattern having a large thickness and exhibiting high dimension precision and high shape precision can be formed efficiently. Consequently, the present invention is allowed to become more effective.

When the photolithography photosensitive paste contains a solvent in a proportion of about 5 percent by weight or less, it becomes possible to form a thick film pattern without conducting drying or with drying for a minimum drying time. Therefore, the present invention is allowed to become more effective.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Figure 1A:
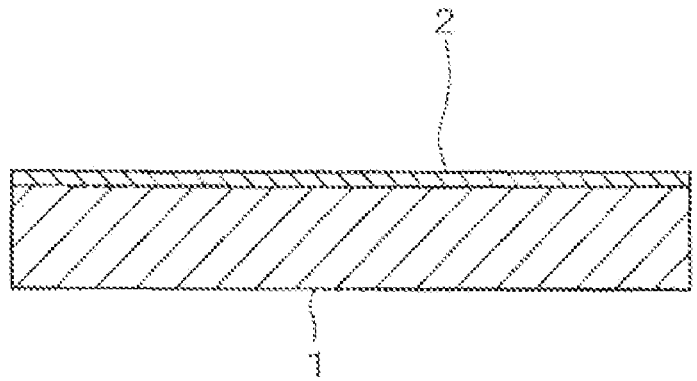
FIGS. 1(a) to (c) are diagrams showing a method for forming a thick film pattern by a method according to a preferred embodiment of the present invention.

When a method for forming a thick film pattern according to a preferred embodiment of the present invention is carried out, it is desirable that a photosensitive paste usually having inorganic powder, photosensitive monomer, and photopolymerization initiator have contents within the following ranges:

(a) inorganic powder: about 60 to about 90 percent by weight (b) photosensitive monomer: about 5 to about 39 percent by weight (c) photopolymerization initiator: about 1 to about 10 percent by weight, respectively.

The content of the inorganic powder is specified to be within the range of about 60 to about 90 percent by weight and, thereby, in the case where a metal powder is used as the inorganic powder, it becomes possible to prevent an occurrence of poor electrical conductivity (increase in conductor resistance). In the case where a ceramic material powder or a glass powder is used as the inorganic powder, it becomes possible to prevent an occurrence of poor insulation.

Furthermore, when the content of the inorganic powder is specified to be within the range of about 60 to about 90 percent by weight, an excessive increase in viscosity of the photosensitive paste, difficulty of handling, deterioration of printability, and the like do not occur, and it becomes possible to keep good photo-curability. In addition, reduction in strength of a cured material and embrittlement of a cured material can be prevented.

With respect to the range of particle diameter of the inorganic powder, when the average particle diameter is specified to be within the range of about 0.1 μm to about 10 μm, agglomeration of particles is suppressed, good dispersibility is maintained, and it becomes possible to produce a fine pattern. In addition, it becomes possible to produce a photosensitive paste having adequate photo-curability and, therefore, this is preferable. It is more preferable that an inorganic powder having an average particle diameter of about 0.5 μm to about 5 μm is used.

Preferably, a spherical inorganic powder is used. However, an inorganic powder in the shape of foil, a granule, a block, a flat material, a plate, a rod, a needle, and the like can also be used, and the shape can be selected appropriately depending on a thick film pattern to be formed.

Alternatively, an electrically conductive powder, a ceramic powder, a glass powder, and the like can be used as the inorganic powder.

Examples of usable electrically conductive powder include Ag, Au, Pt, Pd, Cu, Ni, W, Al, and Mo, and these can also be used in combination. An alloy containing at least one type of the above-described metals can also be used. Furthermore, a metal powder provided with an oxide coating, a nitride coating, or a silicide coating can also be used.

Examples of usable ceramic powders include an oxide, a boride, a nitride, a silicide, and the like of at least one type of metal selected from the group consisting of Al, Ag, Cu, Ni, Ti, Ba, Pb, Zr, Mn, Cr, Sr, Fe, Y, Nb, La, Si, Zn, Bi, B and Ru. A glass composite based ceramic powder can also be used.

Known glass powders, e.g., a borosilicate based glass powder, can be used as the glass powder. More specifically, examples of usable glass powders include glass powders of $SiO_2$—PbO base, $SiO_2$—ZnO base, $SiO_2$—$Bi_2O_3$ base, $SiO_2$—$K_2O$ base, $SiO_2$—$Na_2O$ base, $SiO_2$—PbO—$B_2O_3$ base, $SiO_2$—ZnO—$B_2O_3$ base, $SiO_2$—$Bi_2O_3$—$B_2O_3$ base, $SiO_2$—$K_2O$—$B_2O_3$ base, and $SiO_2$—$Na_2O$—$B_2O_3$ base.

It is possible that the above-described substances are used as the inorganic powder by mixing, that is, Ag and glass can be used by mixing, for example.

It is desirable that the ratio of the photosensitive monomer is within the range of about 5 to about 39 percent by weight, as described above. This is because it becomes possible to prevent reduction in photo-curability and the resulting reduction in strength of a cured material (embrittlement of a cured material) by specifying the proportion of the photosensitive monomer to be within the range of about 5 to about 39 percent by weight and, in addition, it becomes possible to avoid excessive reduction in the proportion of the inorganic powder, while these are preferable.

Examples of photosensitive monomers include stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl)isocyanurate triacrylate, propoxylated trimethylolpropane triacrylate, propoxylated glyceryl triacrylate, pentaerythritol tetraacrylate, tetrahydrofurfuryl methacrylate, cyclohexyl methacrylate, isodecyl methacrylate, lauryl methacrylate, triethylene glycol dimethacrylate, tetraethylene glycol dimethacrylate, 1,9-nonanediol diacrylate, 1,6-hexanediol dimethacrylate, neopentyl glycol dimethacrylate, ethoxylated bisphenol A dimethacrylate, ethoxylated isocyanuric acid diacrylate, ethoxylated paracumylphenol acrylate, ethylhexylcarbitol acrylate, N-vinyl-2-pyrrolidone, isobornyl acrylate, and polypropylene glycol diacrylate.

When a monomer having a double bond concentration within the range of about 8 mmol/g to about 11 mmol/g is used as the photosensitive monomer, in particular, it becomes possible to improve the photo-curing depth.

Examples of photosensitive monomers having a double bond concentration within the range of about 8 mmol/g to about 11 mmol/g include hexanediol triacrylate, tripropylene glycol triacrylate, trimethylolpropane triacrylate, 1,3-butanediol diacrylate, pentaerythritol triacrylate, ditrimethylolpropane tetraacrylate, dipentaerythritolhydroxy pentaacrylate, ethoxylated pentaerythritol tetraacrylate, ethylene glycol dimethacrylate, 1,4-butanediol dimethacrylate, diethylene glycol dimethacrylate, 1,3-butylene glycol dimethacrylate, trimethylolpropane triacrylate, dipentaerythritol pentaacrylate, and dipentaerythritol hexaacrylate.

When a photosensitive paste containing a photosensitive monomer having an ethylene oxide structure with a degree of polymerization of about 3 or less is used, it becomes possible to improve the photo-curing depth. That is, in the case where the degree of polymerization of the ethylene oxide structure is about 3 or less and, therefore, is low, the effect of improving the photo-curing depth is enhanced.

Examples of photosensitive monomers having an ethylene oxide structure with a degree of polymerization of about 3 or less include ethoxylated (ethylene oxide-modified) compounds, e.g., ethoxylated trimethylolpropane triacrylate, and polyethylene glycol diacrylate.

It is desirable that the photopolymerization initiator within the range of about 1 to about 10 percent by weight is included. When the photopolymerization initiator is specified to be within the range of about 1 to about 10 percent by weight, poor photo-curability and reduction in hardness of the cured material due to shortage of photopolymerization initiator are avoided, and it becomes possible to form a pattern having a high aspect ratio. In addition, it becomes possible to prevent the energy from not reaching the inside due to excessive absorption of the ultraviolet light by the photosensitive paste. Consequently, it becomes possible to reliably form a pattern having an adequate thickness and exhibiting high hardness of cured material and, therefore, this is preferable.

Examples of photopolymerization initiators suitable for use in the present invention include benzil, benzoin ethyl ether, benzoin isobutyl ether, benzoin isopropyl ether, benzophenone, benzoylbenzoic acid, methyl benzoyl benzoate, 4-benzoyl-4'-methyldiphenyl sulfide, benzyl dimethyl ketal, 2-n-butoxy-4-dimethylaminobenzoate, 2-chlorothioxanthone, 2,4-diethylthioxanthone, 2,4-diisopropylthioxanthone, isopropylthioxanthone, 2-dimethylaminoethyl benzoate, ethyl p-dimethylaminobenzoate, isoamyl p-dimethylaminobenzoate, 3,3'-dimethyl-4-methoxybenzophenone, 2,4-dimethylthioxanthone, 1-(4-dodecylphenyl)-2-hydroxy-2-methylpropane-1-on, 2,2-dimethoxy-1,2- diphenylethane-1-on, hydroxycyclohexyl phenyl ketone, 2-hydroxy-2-methyl-1-phenylpropane-1-on, 1-[4-(2-hydroxyethoxy)-phenyl]-2-methyl-1-propane-1-on, 2-methyl-1-[4-(methylthio)phenyl]-2-morpholinopropane-1-on, methylbenzoylformate, 1-phenyl-1,2-propanedion-2-(o-ethoxycarbonyl)oxime, 2-benzyl-2-dimethylamino-1-(4-morpholinophenyl)-1-butanone, bis(2,6-dimethoxybenzoyl)-2,4,4-trimethylpentylphosphine oxide, bis(2,4,6-trimethylbenzoyl)phenylphosphine oxide, bis(2,4,6-trimethylbenzoyl)-2,4,4-trimethylpentylphosphine oxide, bis(2,6-dichlorobenzoyl)-2,4,4-trimethylpentylphosphine oxide, 1-(4-isopropylphenyl)-2-hydroxy-2-methylpropane-1-on, 1,2-diphenylethanedion, and methylphenyl glyoxylate. These photopolymerization initiators may be used alone or at least two types thereof may be used at the same time.

In some cases, photosensitizers may be added. Examples of photosensitizers include p-dimethylaminobenzoic acid isoamyl ester and p-dimethylaminobenzoic acid ethyl ester.

A photosensitive paste containing a solvent in a proportion of about 5 percent by weight or less can be used.

Specific examples of solvents include alcohols, e.g., ethanol and isopropyl alcohol; ketones, e.g., methyl ethyl ketone; and aromatic compounds, e.g., xylene. These solvents can also be used by mixing.

It is basically desirable that no solvent is contained from the viewpoint of eliminating the need for a drying step. However, in the case where a solvent is added for the purpose of adjusting the viscosity of the photosensitive paste or in the case where a solvent is added accompanying an additive when the additive or the like is added, no specific problem occurs as long as the proportion of the solvent is about 5 percent by weight or less. Even when the content of the solvent exceeds about 5 percent by weight, the operation and the effect of various preferred embodiments of the present invention is not always impaired, although the drying step is required.

In preferred embodiments of the present invention, if necessary, the photosensitive paste can also include additives, e.g., a thixotropic agent (thickener, anti-settling agent), a dispersing agent, a polymerization inhibitor (radical trapping agent), and an ultraviolet absorber (dye, pigment, HALS=hindered amine based light stabilizer).

The features of the present invention will be described below in further detail with reference to examples of various preferred embodiments thereof.

Example No. 1

Preparation of Photosensitive Paste P1

The following materials were blended and kneaded, so that photosensitive paste P1 containing no polymer was prepared.
Ag powder (average particle diameter=2.8 μm): 75.0 percent by weight
dipentaerythritol hexaacrylate (photosensitive monomer): 17.7 percent by weight
2-methyl-1[4-(methylthio)phenyl]-2-morpholinopropane-1-on: 1.6 percent by weight
2,4-diethylthioxanthone: 0.5 percent by weight
2-benzyl-2-dimethylamino-1-(4-morpholinophenyl)-butanone-1: 2.2 percent by weight
pentamethylene glycol: 3.0 percent by weight
<Formation of Film by Using Photosensitive Paste P1 and Evaluation of Properties>

The photo-curing depth of the resulting photosensitive paste P1 was 18.9 μm at an amount of exposure of 400 mJ/cm$^2$.

Figure 1B:
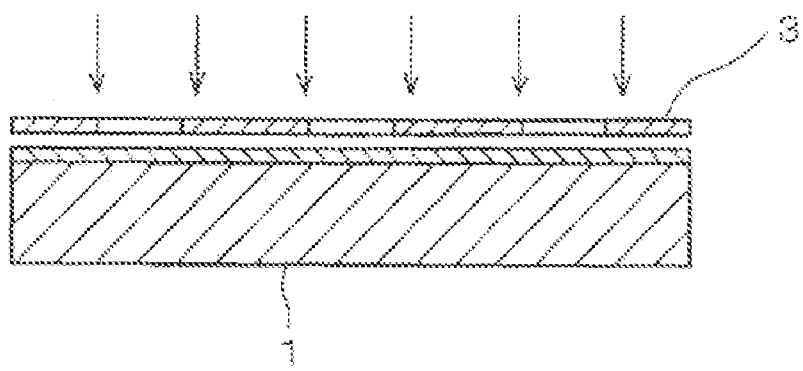
Figure 1C:
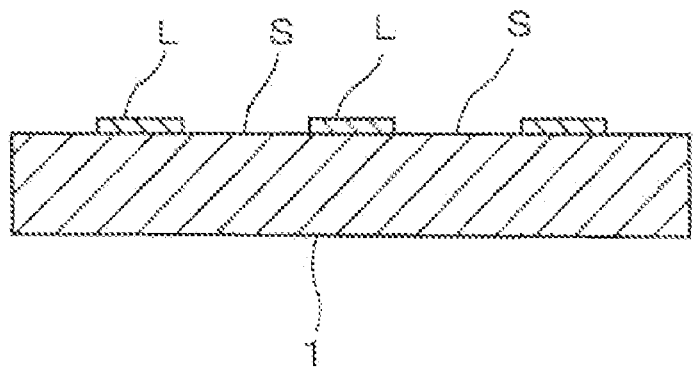

As shown in FIG. 1(a), a film (photosensitive paste film) 2 having a thickness of 17.0 μm was formed on a substrate (an alumina substrate in the present Example) 1 serving as a support through screen printing by using this photosensitive paste P1. Thereafter, the photosensitive paste film 2 was cured by application of ultraviolet light under a condition of 400 mJ/cm$^2$ through a photomask 3, as shown in FIG. 1(b), and uncured portions were removed with ethanol, as shown in FIG. 1(c), so that a thick film pattern was produced, in which a plurality of line-shaped patterns L having the same width were disposed with spaces S therebetween. The lower limit of the pattern width of the line-shaped patterns L was 20 μm, and the lower limit of the space width of the spaces S was 20 μm (hereafter represented by, for example, a minimum L/S=20/20 μm).

The aspect ratio (a ratio of a height dimension to a base dimension (height dimension/base dimension) of a cross section of the pattern was determined from dimensions after firing. The resulting aspect ratio was 0.80.

Subsequently, a film having a thickness of 25 μm was formed on an alumina substrate by using this photosensitive paste P1 through screen printing, and the resulting film was cured by application of ultraviolet light at 400 mJ/cm$^2$. This operation was repeated, so that a paste film having a thickness of 100 μm was formed. The Vickers hardness of this coating film measured 24.6 Hv.

Example No. 2

Preparation of Photosensitive Paste P2

The following materials were blended and kneaded, so that photosensitive paste P2 containing no polymer was prepared.
Ag powder (average particle diameter=2.8 μm): 80.0 percent by weight
dipentaerythritol hexaacrylate (photosensitive monomer): 14.8 percent by weight
2-methyl-1[4-(methylthio)phenyl]-2-morpholinopropane-1-on: 2.0 percent by weight
2,4-diethylthioxanthone: 0.9 percent by weight
2-benzyl-2-dimethylamino-1-(4-morpholinophenyl)-butanone-1: 2.3 percent by weight
<Formation of Film by Using Photosensitive Paste P2 and Evaluation of Properties>

The photo-curing depth of the resulting photosensitive paste P2 was 16.2 μm at an amount of exposure of 400 mJ/cm$^2$. A film having a thickness of 16.0 μm was formed on an alumina substrate through screen printing by using this photosensitive paste P2. Thereafter, the resulting film was cured by application of ultraviolet light under a condition of 400 mJ/cm$^2$ through a photomask, and uncured portions were removed with ethanol. As a result, the minimum L/S was 25/25 μm.

The aspect ratio of the pattern was determined from dimensions after firing. The resulting aspect ratio was 0.69.

Subsequently, a film having a thickness of 25 μm was formed on an alumina substrate by using this photosensitive paste P2 through screen printing, and the resulting film was cured by application of ultraviolet light at 400 mJ/cm$^2$. This operation was repeated, so that a paste film having a thickness of 100 μm was formed. The Vickers hardness of this coating film measured 15.2 Hv.

Example No. 3

Preparation of Photosensitive Paste P3

The following materials were blended and kneaded, so that photosensitive paste P3 containing no polymer was prepared.

Ag powder (average particle diameter=2.8 μm): 85.0 percent by weight dipentaerythritol hexaacrylate (photosensitive monomer): 10.9 percent by weight 2-methyl-1[4-(methylthio)phenyl]-2-morpholinopropane-1-on: 1.2 percent by weight 2,4-diethylthioxanthone: 0.4 percent by weight 2-benzyl-2-dimethylamino-1-(4-morpholinophenyl)-butanone-1: 1.2 percent by weight ethylcarbitol acetate: 1.3 percent by weight <Formation of Film by Using Photosensitive Paste P3 and Evaluation of Properties>

The photo-curing depth of the resulting photosensitive paste P3 was 12.8 μm at an amount of exposure of 400 mJ/cm$^2$. A film having a thickness of 12.0 μm was formed on an alumina substrate through screen printing by using this photosensitive paste P3. Thereafter, the resulting film was cured by application of ultraviolet light under a condition of 400 mJ/cm$^2$ through a photomask, and uncured portions were removed with ethanol. As a result, the minimum L/S was 25/25 μm.

The aspect ratio of the pattern was determined from dimensions after firing. The resulting aspect ratio was 0.61.

Subsequently, a film having a thickness of 25 μm was formed on an alumina substrate by using this photosensitive paste P3 through screen printing, and the resulting film was cured by application of ultraviolet light at 400 mJ/cm$^2$. This operation was repeated, so that a paste film having a thickness of 100 μm was formed. The Vickers hardness of this coating film measured 10.6 Hv.

Example No. 4

Preparation of Photosensitive Paste P4

The following materials were blended and kneaded, so that photosensitive paste P4 containing no polymer was prepared.

Ag powder (average particle diameter=2.8 μm): 71.0 percent by weight dipentaerythritol hexaacrylate (photosensitive monomer): 11.0 percent by weight trimethylolpropane EO-modified (degree of polymerization n=1) triacrylate (photosensitive monomer): 11.0 percent by weight 2-methyl-1[4-(methylthio)phenyl]-2-morpholinopropane-1-on: 1.7 percent by weight 2,4-diethylthioxanthone: 1.5 percent by weight 2-benzyl-2-dimethylamino-1-(4-morpholinophenyl)-butanone-1: 2.3 percent by weight thixotropic agent: 1.5 percent by weight <Formation of Film by Using Photosensitive Paste P4 and Evaluation of Properties>

The photo-curing depth of the resulting photosensitive paste P4 was 22.1 μm at an amount of exposure of 400 mJ/cm$^2$. A film having a thickness of 20.8 μm was formed on an alumina substrate through screen printing by using this photosensitive paste P4. Thereafter, the resulting film was cured by application of ultraviolet light under a condition of 400 mJ/cm$^2$ through a photomask, and uncured portions were removed with acetone. As a result, the minimum L/S was 25/20 μm.

The aspect ratio of the pattern was determined from dimensions after firing. The resulting aspect ratio was 0.68.

Subsequently, a film having a thickness of 25 μm was formed on an alumina substrate by using this photosensitive paste P4 through screen printing, and the resulting film was cured by application of ultraviolet light at 400 mJ/cm$^2$. This operation was repeated, so that a paste film having a thickness of 100 μm was formed. The Vickers hardness of this coating film measured 30.2 Hv.

Example No. 5

Preparation of Photosensitive Paste P5

The following materials were blended and kneaded, so that photosensitive paste P5 containing no polymer was prepared.

Ag powder (average particle diameter=2.8 μm): 75.0 percent by weight dipentaerythritol hexaacrylate (photosensitive monomer): 9.5 percent by weight trimethylolpropane EO-modified (degree of polymerization n=1) triacrylate (photosensitive monomer): 9.5 percent by weight 2-methyl-1[4-(methylthio)phenyl]-2-morpholinopropane-1-on: 2.8 percent by weight 2,4-diethylthioxanthone: 0.7 percent by weight 2-benzyl-2-dimethylamino-1-(4-morpholinophenyl)-butanone-1: 2.5 percent by weight <Formation of Film by Using Photosensitive Paste P5 and Evaluation of Properties>

The photo-curing depth of the resulting photosensitive paste P5 was 18.5 μm at an amount of exposure of 400 mJ/cm$^2$. A film having a thickness of 18.1 μm was formed on an alumina substrate through screen printing by using this photosensitive paste P5. Thereafter, the resulting film was cured by application of ultraviolet light under a condition of 400 mJ/cm$^2$ through a photomask, and uncured portions were removed with acetone. As a result, the minimum L/S was 25/25 μm.

The aspect ratio of the pattern was determined from dimensions after firing. The resulting aspect ratio was 0.62.

Subsequently, a film having a thickness of 25 μm was formed on an alumina substrate by using this photosensitive paste P5 through screen printing, and the resulting film was cured by application of ultraviolet light at 400 mJ/cm$^2$. This operation was repeated, so that a paste film having a thickness of 100 μm was formed. The Vickers hardness of this coating film measured 26.5 Hv.

Example No. 6

Preparation of Photosensitive Paste P6

The following materials were blended and kneaded, so that photosensitive paste P6 containing no polymer was prepared.

Ag powder (average particle diameter=2.8 μm): 80.0 percent by weight dipentaerythritol hexaacrylate (photosensitive monomer): 7.6 percent by weight trimethylolpropane EO-modified (degree of polymerization n=1) triacrylate (photosensitive monomer): 7.6 percent by weight 2-methyl-1[4-(methylthio)phenyl]-2-morpholinopropane-1-on: 1.5 percent by weight 2,4-diethylthioxanthone: 0.6 percent by weight 2-benzyl-2-dimethylamino-1-(4-morpholinophenyl)-butanone-1: 2.0 percent by weight pentamethylene glycol: 0.7 percent by weight <Formation of Film by Using Photosensitive Paste P6 and Evaluation of Properties>

The photo-curing depth of the resulting photosensitive paste P6 was 17.0 μm at an amount of exposure of 400 mJ/cm$^2$. A film having a thickness of 16.8 μm was formed on an alumina substrate through screen printing by using this photosensitive paste P6. Thereafter, the resulting film was cured by application of ultraviolet light under a condition of 400 mJ/cm$^2$ through a photomask, and uncured portions were removed with acetone. As a result, the minimum L/S was 30/30 μm.

The aspect ratio of the pattern was determined from dimensions after firing. The resulting aspect ratio was 0.55.

Subsequently, a film having a thickness of 25 μm was formed on an alumina substrate by using this photosensitive paste P6 through screen printing, and the resulting film was cured by application of ultraviolet light at 400 mJ/cm$^2$. This operation was repeated, so that a paste film having a thickness of 100 μm was formed. The Vickers hardness of this coating film measured 17.1 Hv.

Example No. 7

Preparation of Photosensitive Paste P7

The following materials were blended and kneaded, so that photosensitive paste P7 containing no polymer was prepared.
Ag powder (average particle diameter=2.8 μm): 80.0 percent by weight
Si—B based glass powder (average particle diameter=1.5 μm): 2.4 percent by weight
dipentaerythritol hexaacrylate (photosensitive monomer): 15.0 percent by weight
2-methyl-1[4-(methylthio)phenyl]-2-morpholinopropane-1-on: 1.5 percent by weight
2,4-diethylthioxanthone: 0.6 percent by weight
2-benzyl-2-dimethylamino-1-(4-morpholinophenyl)-butanone-1: 0.5 percent by weight
<Formation of Film by Using Photosensitive Paste P7 and Evaluation of Properties>

The photo-curing depth of the resulting photosensitive paste P7 was 15.2 μm at an amount of exposure of 400 mJ/cm$^2$.

Figure 2A:
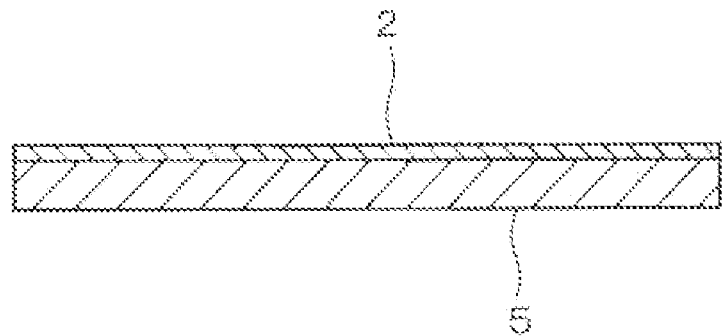
FIGS. 2(a) to (d) are diagrams showing a method for forming a thick film pattern by another method according to a further preferred embodiment of the present invention.
Figure 2B:
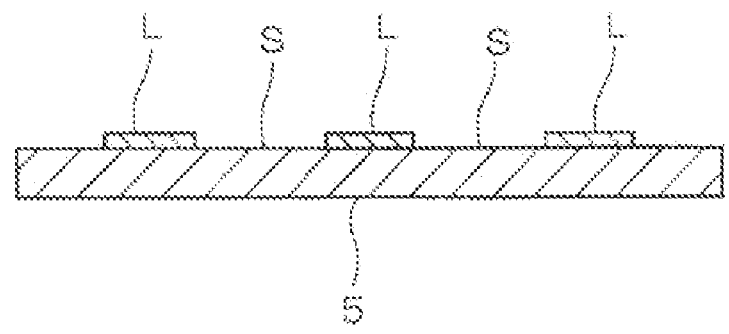

As shown in FIG. 2(a), a film (photosensitive paste film) 2 having a thickness of 14.7 μm was formed on a PET film 5 serving as a support through screen printing by using this photosensitive paste P7. Thereafter, the resulting film 2 was cured by application of ultraviolet light under a condition of 400 mJ/cm$^2$ through a photomask, and uncured portions were removed with ethanol, as shown in FIG. 2(b). As a result, the minimum ratio of the line-shaped pattern L to the space S (L/S) was 25/30 μm.

Figure 2C:
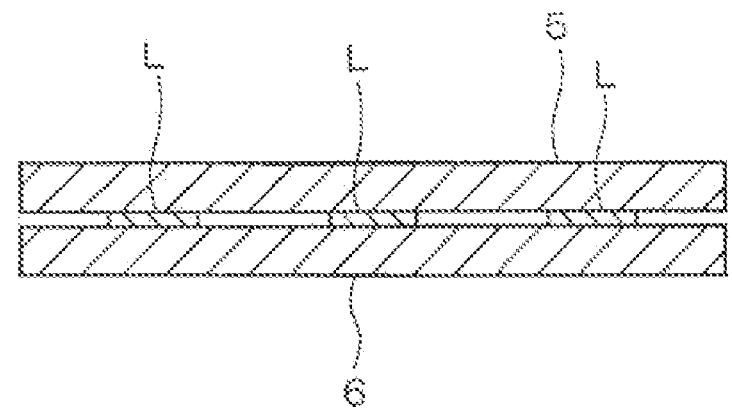
Figure 2D:
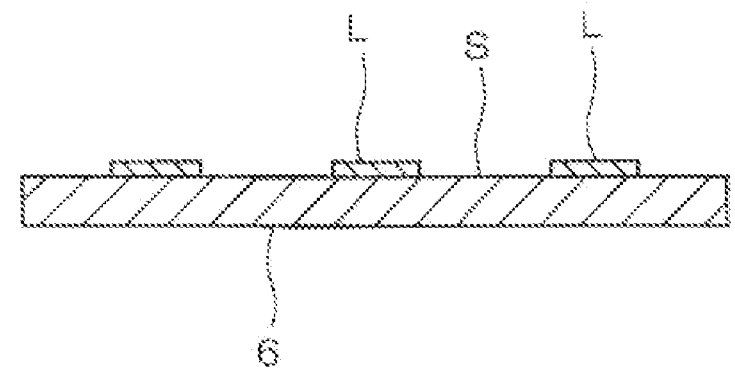

Subsequently, the pattern (thick film pattern) L disposed on this PET film 5 was turned upside down and, as shown in FIG. 2(c), was pressed and transferred to a green sheet 6 by using a thermocompression bonding device under the condition of 60° C., 0.5 MPa, and 60 seconds, so that a pattern (thick film pattern) L was formed on the green sheet 6, as shown in FIG. 2(d). This pattern L was fired and the width and the thickness of the pattern were observed with a laser microscope. The resulting aspect ratio was 0.51.

A film having a thickness of 25 μm was formed on an alumina substrate by using this photosensitive paste P7 through screen printing, and the resulting film was cured by application of ultraviolet light at 400 mJ/cm$^2$. This operation was repeated, so that a paste film having a thickness of 100 μm was formed. The Vickers hardness of this coating film measured 14.8 Hv.

Example No. 8

Preparation of Photosensitive Paste P8

The following materials were blended and kneaded, so that photosensitive paste P8 containing no polymer was prepared.

Ag powder (average particle diameter=2.8 μm): 56.3 percent by weight
$Al_2O_3$-coated Ag (average particle diameter=2.0 μm): 18.8 percent by weight
Si—B based glass powder (average particle diameter=1.5 μm): 2.4 percent by weight
dipentaerythritol hexaacrylate (photosensitive monomer): 16.5 percent by weight
2-methyl-1[4-(methylthio)phenyl]-2-morpholinopropane-1-on: 1.5 percent by weight
2,4-diethylthioxanthone: 0.9 percent by weight
2-benzyl-2-dimethylamino-1-(4-morpholinophenyl)-butanone-1: 2.3 percent by weight
dipropylene glycol monomethyl ether: 1.3 percent by weight
<Formation of Film by Using Photosensitive Paste P8 and Evaluation of Properties>

The photo-curing depth of the resulting photosensitive paste P8 was 13.9 μm at an amount of exposure of 400 mJ/cm$^2$. A film having a thickness of 13.0 μm was formed on a PET film serving as a support through screen printing by using this photosensitive paste P8. Thereafter, the resulting film was cured by application of ultraviolet light under a condition of 400 mJ/cm$^2$ through a photomask, and uncured portions were removed with ethanol. As a result, the minimum L/S was 25/30 μm.

Subsequently, the pattern disposed on this PET film was turned upside down, and was pressed and transferred to a green sheet by using a thermocompression bonding device under the condition of 60° C., 0.5 MPa, and 60 seconds. The resulting pattern was fired and the width and the thickness of the pattern were observed with a laser microscope. The resulting aspect ratio was 0.45.

A film having a thickness of 25 μm was formed on an alumina substrate by using this photosensitive paste P8 through screen printing, and the resulting film was cured by application of ultraviolet light at 400 mJ/cm$^2$. This operation was repeated, so that a paste film having a thickness of 100 μm was formed. The Vickers hardness of this coating film measured 15.4 Hv.

Example No. 9

Preparation of Photosensitive Paste P9

The following materials were blended and kneaded, so that photosensitive paste P9 containing no polymer was prepared.
Cu powder (average particle diameter=2.5 μm): 77.0 percent by weight
dipentaerythritol hexaacrylate (photosensitive monomer): 14.0 percent by weight
2-methyl-1[4-(methylthio)phenyl]-2-morpholinopropane-1-on: 1.0 percent by weight
2,4-diethylthioxanthone: 0.4 percent by weight
2-benzyl-2-dimethylamino-1-(4-morpholinophenyl)-butanone-1: 1.6 percent by weight
dipropylene glycol monomethyl ether: 3.0 percent by weight
pentamethylene glycol: 3.0 percent by weight
<Formation of Film by Using Photosensitive Paste P9 and Evaluation of Properties>

The photo-curing depth of the resulting photosensitive paste P9 was 15.8 μm at an amount of exposure of 400 mJ/cm$^2$. A film having a thickness of 15.1 μm was formed on an alumina substrate through screen printing by using this photosensitive paste P9. Thereafter, the resulting film was cured by application of ultraviolet light under a condition of 400 mJ/cm² through a photomask, and uncured portions were removed with ethanol. As a result, the minimum L/S was 30/30 μm.

The aspect ratio of the pattern was determined from dimensions after firing. The resulting aspect ratio was 0.59.

Subsequently, a film having a thickness of 25 μm was formed on an alumina substrate by using this photosensitive paste P9 through screen printing, and the resulting film was cured by application of ultraviolet light at 400 mJ/cm². This operation was repeated, so that a paste film having a thickness of 100 μm was formed. The Vickers hardness of this coating film measured 17.8 Hv.

Example No. 10

Preparation of Photosensitive Paste P10

The following materials were blended and kneaded, so that photosensitive paste P10 containing no polymer was prepared.

Cu powder (average particle diameter=2.5 μm): 80.0 percent by weight
dipentaerythritol hexaacrylate (photosensitive monomer): 14.0 percent by weight
2-methyl-1[4-(methylthio)phenyl]-2-morpholinopropane-1-on: 1.8 percent by weight
2,4-diethylthioxanthone: 0.9 percent by weight
2-benzyl-2-dimethylamino-1-(4-morpholinophenyl)-butanone-1: 2.1 percent by weight
di-n-butyl phthalate: 1.2 percent by weight <Formation of Film by Using Photosensitive Paste P10 and Evaluation of Properties>

The photo-curing depth of the resulting photosensitive paste P10 was 14.8 μm at an amount of exposure of 400 mJ/cm². A film having a thickness of 13.8 μm was formed on an alumina substrate through screen printing by using this photosensitive paste P10. Thereafter, the resulting film was cured by application of ultraviolet light under a condition of 400 mJ/cm² through a photomask, and uncured portions were removed with ethanol. As a result, the minimum L/S was 25/25 μm.

The aspect ratio of the pattern was determined from dimensions after firing. The resulting aspect ratio was 0.53.

Subsequently, a film having a thickness of 25 μm was formed on an alumina substrate by using this photosensitive paste P10 through screen printing, and the resulting film was cured by application of ultraviolet light at 400 mJ/cm². This operation was repeated, so that a paste film having a thickness of 100 μm was formed. The Vickers hardness of this coating film measured 16.9 Hv.

Example No. 11

Preparation of Photosensitive Paste P11

The following materials were blended and kneaded, so that photosensitive paste P11 containing no polymer was prepared.

AgPd powder (average particle diameter=2.0 μm): 80.0 percent by weight
dipentaerythritol hexaacrylate (photosensitive monomer): 14.0 percent by weight
2-methyl-1[4-(methylthio)phenyl]-2-morpholinopropane-1-on: 3.0 percent by weight
2,4-diethylthioxanthone: 0.9 percent by weight
2-benzyl-2-dimethylamino-1-(4-morpholinophenyl)-butanone-1: 2.1 percent by weight <Formation of Film by Using Photosensitive Paste P11 and Evaluation of Properties>

The photo-curing depth of the resulting photosensitive paste P11 was 14.1 μm at an amount of exposure of 400 mJ/cm². A film having a thickness of 14.0 μm was formed on an alumina substrate through screen printing by using this photosensitive paste P11. Thereafter, the resulting film was cured by application of ultraviolet light under a condition of 400 mJ/cm² through a photomask, and uncured portions were removed with ethanol. As a result, the minimum L/S was 20/20 μm.

The aspect ratio of the pattern was determined from dimensions after firing. The resulting aspect ratio was 0.70.

Subsequently, a film having a thickness of 25 μm was formed on an alumina substrate by using this photosensitive paste P11 through screen printing, and the resulting film was cured by application of ultraviolet light at 400 mJ/cm². This operation was repeated, so that a paste film having a thickness of 100 μm was formed. The Vickers hardness of this coating film measured 15.7 Hv.

Example No. 12

Preparation of Photosensitive Paste P12

The following materials were blended and kneaded, so that photosensitive paste P12 containing no polymer was prepared.

Ag powder (average particle diameter=3.0 μm): 75.0 percent by weight
trimethylolpropane triacrylate (not modified by ethylene oxide) (photosensitive monomer): 16.5 percent by weight
2-methyl-1[4-(methylthio)phenyl]-2-morpholinopropane-1-on: 5.0 percent by weight
2,4-diethylthioxanthone: 2.0 percent by weight
thixotropic agent: 1.5 percent by weight <Formation of Film by Using Photosensitive Paste P12 and Evaluation of Properties>

The photo-curing depth of the resulting photosensitive paste P12 was 17.1 μm at an amount of exposure of 400 mJ/cm². A film having a thickness of 17.0 μm was formed on an alumina substrate through screen printing by using this photosensitive paste P12. Thereafter, the resulting film was cured by application of ultraviolet light under a condition of 400 mJ/cm² through a photomask, and uncured portions were removed with ethanol. As a result, the minimum L/S was 30/30 μm.

The aspect ratio of the pattern was determined from dimensions after firing. The resulting aspect ratio was 0.61.

Subsequently, a film having a thickness of 25 μm was formed on an alumina substrate by using this photosensitive paste P12 through screen printing, and the resulting film was cured by application of ultraviolet light at 400 mJ/cm². This operation was repeated, so that a paste film having a thickness of 100 μm was formed. The Vickers hardness of this coating film measured 27.5 Hv.

Example No. 13

Preparation of Photosensitive Paste P13

The following materials were blended and kneaded, so that photosensitive paste P13 containing a polymer within the scope of the present invention was prepared.

Ag powder (average particle diameter=2.8 μm): 75.0 percent by weight
acrylic copolymer (polymer): 0.5 percent by weight trimethylolpropane EO-modified (degree of polymerization n=1) triacrylate (photosensitive monomer): 14.5 percent by weight (photosensitive monomer/(photosensitive monomer+ polymer)=14.5/(14.5+0.5)=0.97)

benzyl dimethyl ketal: 2.0 percent by weight
bis(2,4,6-trimethylbenzoyl)-phenylphosphine oxide: 2.0 percent by weight
dipropylene glycol monomethyl ether: 5.0 percent by weight
thixotropic agent: 1.0 percent by weight <Formation of Film by Using Photosensitive Paste P13 and Evaluation of Properties>

The photo-curing depth of the resulting photosensitive paste P13 was 16.7 μm at an amount of exposure of 400 mJ/cm². A film having a thickness of 16.5 μm was formed on an alumina substrate through screen printing by using this photosensitive paste P13. Thereafter, the resulting film was cured by application of ultraviolet light under a condition of 400 mJ/cm² through a photomask, and uncured portions were removed with ethanol. As a result, the minimum L/S was 25/25 μm.

The aspect ratio of the pattern was determined from dimensions after firing. The resulting aspect ratio was 0.68.

Subsequently, a film having a thickness of 25 μm was formed on an alumina substrate by using this photosensitive paste P13 through screen printing, and the resulting film was cured by application of ultraviolet light at 400 mJ/cm². This operation was repeated, so that a paste film having a thickness of 100 μm was formed. The Vickers hardness of this coating film measured 19.9 Hv.

Example No. 14

Preparation of Photosensitive Paste P14

The following materials were blended and kneaded, so that photosensitive paste P14 containing a polymer within the scope of the present invention was prepared.

Ag powder (average particle diameter=2.8 μm): 75.0 percent by weight
acrylic copolymer (polymer): 1.0 percent by weight
dipentaerythritol hexaacrylate (photosensitive monomer): 17.5 percent by weight (photosensitive monomer/(photosensitive monomer+ polymer)=17.5/(17.5+1.0)=0.95)

1-hydroxy-cyclohexyl-phenyl-ketone: 2.5 percent by weight
bis(2,4,6-trimethylbenzoyl)-phenylphosphine oxide: 3.0 percent by weight
dipropylene glycol monomethyl ether: 1.0 percent by weight <Formation of Film by Using Photosensitive Paste P14 and Evaluation of Properties>

The photo-curing depth of the resulting photosensitive paste P14 was 16.0 μm at an amount of exposure of 400 mJ/cm². A film having a thickness of 15.8 μm was formed on an alumina substrate through screen printing by using this photosensitive paste P14. Thereafter, the resulting film was cured by application of ultraviolet light under a condition of 400 mJ/cm² through a photomask, and uncured portions were removed with ethanol. As a result, the minimum L/S was 25/25 μm.

The aspect ratio of the pattern was determined from dimensions after firing. The resulting aspect ratio was 0.62.

Subsequently, a film having a of 25 μm was formed on an alumina substrate by using this photosensitive paste P14 through screen printing, and the resulting film was cured by application of ultraviolet light at 400 mJ/cm². This operation was repeated, so that a paste film having a thickness of 100 μm was formed. The Vickers hardness of this coating film measured 18.5 Hv.

Example No. 15

Preparation of Photosensitive Paste P15

The following materials were blended and kneaded, so that photosensitive paste P15 containing a polymer within the scope of the present invention was prepared.

Ag powder (average particle diameter=2.8 μm): 75.0 percent by weight
acrylic copolymer (polymer): 1.0 percent by weight
dipentaerythritol hexaacrylate (photosensitive monomer): 9.0 percent by weight (photosensitive monomer/(photosensitive monomer+ polymer)=9.0/(9.0+1.0)=0.90)

1-hydroxy-cyclohexyl-phenyl-ketone: 3.5 percent by weight
bis(2,4,6-trimethylbenzoyl)-phenylphosphine oxide: 5.5 percent by weight
dipropylene glycol monomethyl ether: 4.0 percent by weight
thixotropic agent: 2.0 percent by weight <Formation of Film by Using Photosensitive Paste P15 and Evaluation of Properties>

The photo-curing depth of the resulting photosensitive paste P15 was 15.6 μm at an amount of exposure of 400 mJ/cm². A film having a thickness of 15.1 μm was formed on an alumina substrate through screen printing by using this photosensitive paste P15. Thereafter, the resulting film was cured by application of ultraviolet light under a condition of 400 mJ/cm² through a photomask, and uncured portions were removed with ethanol. As a result, the minimum L/S was 25/25 μm.

The aspect ratio of the pattern was determined from dimensions after firing. The resulting aspect ratio was 0.60.

Subsequently, a film having a thickness of 25 μm was formed on an alumina substrate by using this photosensitive paste P15 through screen printing, and the resulting film was cured by application of ultraviolet light at 400 mJ/cm². This operation was repeated, so that a paste film having a thickness of 100 μm was formed. The Vickers hardness of this coating film measured 18.4 Hv.

Example No. 16

Preparation of Photosensitive Paste P16

The following materials were blended and kneaded, so that photosensitive paste P16 containing a polymer within the scope of the present invention was prepared.

Ag powder (average particle diameter=2.8 μm): 75.0 percent by weight
acrylic copolymer (polymer): 2.0 percent by weight
dipentaerythritol hexaacrylate (photosensitive monomer): 12.5 percent by weight (photosensitive monomer/(photosensitive monomer+ polymer)=12.5/(12.5+2.0)=0.86)

1-hydroxy-cyclohexyl-phenyl-ketone: 2.0 percent by weight 2-benzyl-2-dimethylamino-1-(4-morpholinophenyl)-butanone-1: 3.2 percent by weight dipropylene glycol monomethyl ether: 3.8 percent by weight thixotropic agent: 1.5 percent by weight <Formation of Film by Using Photosensitive Paste P16 and Evaluation of Properties>

The photo-curing depth of the resulting photosensitive paste P16 was 14.2 μm at an amount of exposure of 400 mJ/cm$^2$. A film having a thickness of 14.0 μm was formed on an alumina substrate through screen printing by using this photosensitive paste P16. Thereafter, the resulting film was cured by application of ultraviolet light under a condition of 400 mJ/cm$^2$ through a photomask, and uncured portions were removed with ethanol. As a result, the minimum L/S was 30/25 μm.

The aspect ratio of the pattern was determined from dimensions after firing. The resulting aspect ratio was 0.48.

Subsequently, a film having a thickness of 25 μm was formed on an alumina substrate by using this photosensitive paste P16 through screen printing, and the resulting film was cured by application of ultraviolet light at 400 mJ/cm$^2$. This operation was repeated, so that a paste film having a thickness of 100 μm was formed. The Vickers hardness of this coating film measured 18.0 Hv.

Example No. 17

Preparation of Photosensitive Paste P17

The following materials were blended and kneaded, so that photosensitive paste P17 containing no polymer was prepared.

Ag powder (average particle diameter=3.0 μm): 75.0 percent by weight trimethylolpropane EO-modified (degree of polymerization n=1) triacrylate (photosensitive monomer): 16.0 percent by weight 2-methyl-1[4-(methylthio)phenyl]-2-morpholinopropane-1-on: 4.5 percent by weight 2,4-diethylthioxanthone: 1.0 percent by weight 2-benzyl-2-dimethylamino-1-(4-morpholinophenyl)-butanone-1: 1.5 percent by weight thixotropic agent: 2.0 percent by weight <Formation of Film by Using Photosensitive Paste P17 and Evaluation of Properties>

The photo-curing depth of the resulting photosensitive paste P17 was 12.5 μm at an amount of exposure of 400 mJ/cm$^2$. A film having a thickness of 11.5 μm was formed on an alumina substrate through screen printing by using this photosensitive paste P17. Thereafter, the resulting film was cured by application of ultraviolet light under a condition of 400 mJ/cm$^2$ through a photomask, and uncured portions were removed with ethanol. As a result, the minimum L/S was 30/25 μm.

The aspect ratio of the pattern was determined from dimensions after firing. The resulting aspect ratio was 0.55.

Subsequently, a film having a thickness of 25 μm was formed on an alumina substrate by using this photosensitive paste P17 through screen printing, and the resulting film was cured by application of ultraviolet light at 400 mJ/cm$^2$. This operation was repeated, so that a paste film having a thickness of 100 μm was formed. The Vickers hardness of this coating film measured 15.8 Hv.

Example No. 18

Preparation of Photosensitive Paste P18

The following materials were blended and kneaded, so that photosensitive paste P18 containing no polymer was prepared.

Ag powder (average particle diameter=3.0 μm): 75.0 percent by weight triallyl isocyanurate (photosensitive monomer): 17.5 percent by weight 2-methyl-1[4-(methylthio)phenyl]-2-morpholinopropane-1-on: 2.5 percent by weight 2,4-diethylthioxanthone: 0.9 percent by weight 2-benzyl-2-dimethylamino-1-(4-morpholinophenyl)-butanone-1: 2.5 percent by weight thixotropic agent: 1.6 percent by weight <Formation of Film by Using Photosensitive Paste P18 and Evaluation of Properties>

The photo-curing depth of the resulting photosensitive paste P18 was 13.8 μm at an amount of exposure of 400 mJ/cm$^2$. A film having a thickness of 12.5 μm was formed on an alumina substrate through screen printing by using this photosensitive paste P18. Thereafter, the resulting film was cured by application of ultraviolet light under a condition of 400 mJ/cm$^2$ through a photomask, and uncured portions were removed with ethanol. As a result, the minimum L/S was 35/35 μm.

The aspect ratio of the pattern was determined from dimensions after firing. The resulting aspect ratio was 0.35.

Subsequently, a film having a thickness of 25 μm was formed on an alumina substrate by using this photosensitive paste P18 through screen printing, and the resulting film was cured by application of ultraviolet light at 400 mJ/cm$^2$. This operation was repeated, so that a paste film having a thickness of 100 μm was formed. The Vickers hardness of this coating film measured 14.3 Hv.

Example No. 19

Preparation of Photosensitive Paste P19

The following materials were blended and kneaded, so that photosensitive paste P19 containing no polymer was prepared.

Ag powder (average particle diameter=3.0 μm): 75.0 percent by weight trimethylolpropane EO-modified (degree of polymerization n=3) triacrylate (photosensitive monomer): 18.0 percent by weight benzyl dimethyl ketal: 2.5 percent by weight 2-benzyl-2-dimethylamino-1-(4-morpholinophenyl)-butanone-1: 2.5 percent by weight thixotropic agent: 2.0 percent by weight <Formation of Film by Using Photosensitive Paste P19 and Evaluation of Properties>

The photo-curing depth of the resulting photosensitive paste P19 was 11.3 μm at an amount of exposure of 400 mJ/cm$^2$. A film having a thickness of 10.0 μm was formed on an alumina substrate through screen printing by using this photosensitive paste P19. Thereafter, the resulting film was cured by application of ultraviolet light under a condition of 400 mJ/cm$^2$ through a photomask, and uncured portions were removed with ethanol. As a result, the minimum L/S was 35/30 μm.

The aspect ratio of the pattern was determined from dimensions after firing. The resulting aspect ratio was 0.30.

Subsequently, a film having a thickness of 25 μm was formed on an alumina substrate by using this photosensitive paste P19 through screen printing, and the resulting film was cured by application of ultraviolet light at 400 mJ/cm². This operation was repeated, so that a paste film having a thickness of 100 μm was formed. The Vickers hardness of this coating film measured 13.2 Hv.

Example No. 20

Preparation of Photosensitive Paste P20

The following materials were blended and kneaded, so that photosensitive paste P20 containing no polymer was prepared.

Ag powder (average particle diameter=3.0 μm): 75.0 percent by weight trimethylolpropane EO-modified (degree of polymerization n=4) triacrylate (photosensitive monomer): 18.5 percent by weight 2-methyl-1[4-(methylthio)phenyl]-2-morpholinopropane-1-on: 2.5 percent by weight 2,4-diethylthioxanthone: 0.9 percent by weight 2-benzyl-2-dimethylamino-1-(4-morpholinophenyl)-butanone-1: 1.6 percent by weight thixotropic agent: 1.5 percent by weight <Formation of Film by Using Photosensitive Paste P20 and Evaluation of Properties>

The photo-curing depth of the resulting photosensitive paste P20 was 11.0 μm at an amount of exposure of 400 mJ/cm². A film having a thickness of 9.5 μm was formed on an alumina substrate through screen printing by using this photosensitive paste P20. Thereafter, the resulting film was cured by application of ultraviolet light under a condition of 400 mJ/cm² through a photomask, and uncured portions were removed with ethanol. As a result, the minimum L/S was 40/30 μm.

The aspect ratio of the pattern was determined from dimensions after firing. The resulting aspect ratio was 0.29.

Subsequently, a film having a thickness of 25 μm was formed on an alumina substrate by using this photosensitive paste P20 through screen printing, and the resulting film was cured by application of ultraviolet light at 400 mJ/cm². This operation was repeated, so that a paste film having a thickness of 100 μm was formed. The Vickers hardness of this coating film measured 13.1 Hv.

Example No. 21

Preparation of Photosensitive Paste P21

The following materials were blended and kneaded, so that photosensitive paste P21 containing no polymer was prepared.

Ag powder (average particle diameter=2.8 μm): 80.0 percent by weight dipentaerythritol hexaacrylate (photosensitive monomer): 13.2 percent by weight 2-methyl-1[4-(methylthio)phenyl]-2-morpholinopropane-1-on: 2.0 percent by weight 2,4-diethylthioxanthone: 0.9 percent by weight 2-benzyl-2-dimethylamino-1-(4-morpholinophenyl)-butanone-1: 2.3 percent by weight ultraviolet absorber (anthraquinone based dye): 1.6 percent by weight <Formation of Film by Using Photosensitive Paste P21 and Evaluation of Properties>

The photo-curing depth of the resulting photosensitive paste P21 was 15.5 μm at an amount of exposure of 400 mJ/cm². A film having a thickness of 14.8 μm was formed on an alumina substrate through screen printing by using this photosensitive paste P21. Thereafter, the resulting film was cured by application of ultraviolet light under a condition of 400 mJ/cm² through a photomask, and uncured portions were removed with ethanol. As a result, the minimum L/S was 25/20 μm.

The aspect ratio of the pattern was determined from dimensions after firing. The resulting aspect ratio was 0.65.

Subsequently, a film having a thickness of 25 μm was formed on an alumina substrate by using this photosensitive paste P21 through screen printing, and the resulting film was cured by application of ultraviolet light at 400 mJ/cm². This operation was repeated, so that a paste film having a thickness of 100 μm was formed. The Vickers hardness of this coating film measured 15.1 Hv.

Comparative Example No. 1

Preparation of Photosensitive Paste P01

The following materials were blended and kneaded, so that photosensitive paste P01 containing a polymer outside of the scope of the present invention was prepared.

Ag powder (average particle diameter=2.8 μm): 75.0 percent by weight acrylic copolymer (polymer): 3.0 percent by weight dipentaerythritol hexaacrylate (photosensitive monomer): 13.0 percent by weight (photosensitive monomer/(photosensitive monomer+ polymer)=13.0/(13.0+3.0)=0.81)

2-methyl-1[4-(methylthio)phenyl]-2-morpholinopropane-1-on: 2.0 percent by weight 2,4-diethylthioxanthone: 0.5 percent by weight 2-benzyl-2-dimethylamino-1-(4-morpholinophenyl)-butanone-1: 3.0 percent by weight dipropylene glycol monomethyl ether: 2.0 percent by weight thixotropic agent: 1.5 percent by weight <Formation of Film by Using Photosensitive Paste P01 and Evaluation of Properties>

The photo-curing depth of the resulting photosensitive paste P01 was 9.6 μm at an amount of exposure of 400 mJ/cm². A film having a thickness of 9.6 μm was formed on an alumina substrate through screen printing by using this photosensitive paste P01. Thereafter, the resulting film was cured by application of ultraviolet light under a condition of 400 mJ/cm² through a photomask, and uncured portions were removed with ethanol. As a result, the minimum L/S was 30/30 μm.

The aspect ratio of the pattern was determined from dimensions after firing. The resulting aspect ratio was 0.32.

Subsequently, a film having a thickness of 25 μm was formed on an alumina substrate by using this photosensitive paste P01 through screen printing, and the resulting film was cured by application of ultraviolet light at 400 mJ/cm². This operation was repeated, so that a paste film having a thickness of 100 μm was formed. The Vickers hardness of this coating film measured 17.3 Hv.

Comparative Example No. 2

Preparation of Photosensitive Paste P02

The following materials were blended and kneaded, so that photosensitive paste P02 containing a polymer outside of the scope of the present invention was prepared.

Ag powder (average particle diameter=2.8 μm): 75.0 percent by weight acrylic copolymer (polymer): 4.0 percent by weight dipentaerythritol hydroxypentaacrylate (photosensitive monomer): 11.5 percent by weight (photosensitive monomer/(photosensitive monomer+ polymer)=11.5/(11.5+4.0)=0.74)

2-methyl-1[4-(methylthio)phenyl]-2-morpholinopropane-1-on: 2.5 percent by weight 2,4-diethylthioxanthone: 0.5 percent by weight 2-benzyl-2-dimethylamino-1-(4-morpholinophenyl)-butanone-1: 1.0 percent by weight dipropylene glycol monomethyl ether: 3.5 percent by weight thixotropic agent: 2.0 percent by weight <Formation of Film by Using Photosensitive Paste P02 and Evaluation of Properties>

The photo-curing depth of the resulting photosensitive paste P02 was 6.7 μm at an amount of exposure of 400 mJ/cm². A film having a thickness of 6.7 μm was formed on an alumina substrate through screen printing by using this photosensitive paste P02. Thereafter, the resulting film was cured by application of ultraviolet light under a condition of 400 mJ/cm² through a photomask, and uncured portions were removed with a 0.5 percent by weight sodium carbonate aqueous solution. As a result, the minimum L/S was 30/30 μm.

The aspect ratio of the pattern was determined from dimensions after firing. The resulting aspect ratio was 0.27.

Subsequently, a film having a thickness of 25 μm was formed on an alumina substrate by using this photosensitive paste P02 through screen printing, and the resulting film was cured by application of ultraviolet light at 400 mJ/cm². This operation was repeated, so that a paste film having a thickness of 100 μm was formed. The Vickers hardness of this coating film measured 15.4 Hv.

Comparative Example No. 3

Preparation of Photosensitive Paste P03

The following materials were blended and kneaded, so that photosensitive paste P03 containing a polymer outside of the scope of the present invention was prepared.

Ag powder (average particle diameter=2.8 μm): 74.0 percent by weight acrylic polymer (polymer): 6.2 percent by weight trimethylolpropane EO-modified (degree of polymerization n=1) triacrylate (photosensitive monomer): 6.0 percent by weight (photosensitive monomer/(photosensitive monomer+ polymer)=6.0/(6.0+6.2)=0.49)

2-methyl-1[4-(methylthio)phenyl]-2-morpholinopropane-1-on: 0.6 percent by weight 2,4-diethylthioxanthone: 0.2 percent by weight 2-benzyl-2-dimethylamino-1-(4-morpholinophenyl)-butanone-1: 0.9 percent by weight dipropylene glycol monomethyl ether: 11.6 percent by weight thixotropic agent: 0.5 percent by weight <Formation of Film by Using Photosensitive Paste P03 and Evaluation of Properties>

The photo-curing depth of the resulting photosensitive paste P03 was 9.1 μm at an amount of exposure of 400 mJ/cm². A film having a thickness of 8.5 μm was formed on an alumina substrate through screen printing by using this photosensitive paste P03. Thereafter, the resulting film was cured by application of ultraviolet light under a condition of 400 mJ/cm² through a photomask, and uncured portions were removed with a 0.5 percent by weight sodium carbonate aqueous solution. As a result, the minimum L/S was 25/25 μm.

The aspect ratio of the pattern was determined from dimensions after firing. The resulting aspect ratio was 0.43.

Subsequently, a film having a thickness of 25 μm was formed on an alumina substrate by using this photosensitive paste P03 through screen printing, and the resulting film was cured by application of ultraviolet light at 400 mJ/cm². This operation was repeated, so that a paste film having a thickness of 100 μm was formed. The Vickers hardness of this coating film measured 18.8 Hv.

Comparative Example No. 4

Preparation of Photosensitive Paste P04

The following materials were blended and kneaded, so that photosensitive paste P04 containing a polymer outside of the scope of the present invention was prepared.

Ag powder (average particle diameter=2.8 μm): 77.0 percent by weight acrylic polymer (polymer): 5.5 percent by weight trimethylolpropane EO-modified (degree of polymerization n=1) triacrylate (photosensitive monomer): 6.2 percent by weight (photosensitive monomer/(photosensitive monomer+ polymer)=6.2/(6.2+5.5)=0.53)

2-methyl-1[4-(methylthio)phenyl]-2-morpholinopropane-1-on: 1.0 percent by weight 2,4-diethylthioxanthone: 0.2 percent by weight 2-benzyl-2-dimethylamino-1-(4-morpholinophenyl)-butanone-1: 0.4 percent by weight pentamethylene glycol: 1.2 percent by weight dipropylene glycol monomethyl ether: 8.5 percent by weight <Formation of Film by Using Photosensitive Paste P04 and Evaluation of Properties>

The photo-curing depth of the resulting photosensitive paste P04 was 7.2 μm at an amount of exposure of 400 mJ/cm². A film having a thickness of 7.0 μm was formed on an alumina substrate through screen printing by using this photosensitive paste P04. Thereafter, the resulting film was cured by application of ultraviolet light under a condition of 400 mJ/cm² through a photomask, and uncured portions were removed with a 0.5 percent by weight sodium carbonate aqueous solution. As a result, the minimum L/S was 30/25 μm.

The aspect ratio of the pattern was determined from dimensions after firing. The resulting aspect ratio was 0.31.

Subsequently, a film having a thickness of 25 μm was formed on an alumina substrate by using this photosensitive paste P04 through screen printing, and the resulting film was cured by application of ultraviolet light at 400 mJ/cm². This operation was repeated, so that a paste film having a thickness of 100 μm was formed. The Vickers hardness of this coating film measured 12.7 Hv.

Comparative Example No. 5

Preparation of Photosensitive Paste P05

The following materials were blended and kneaded, so that photosensitive paste P05 containing a polymer outside of the scope of the present invention was prepared.

Ag powder (average particle diameter=2.8 μm): 80 percent by weight

Si—B based glass powder (average particle diameter=1.5 μm): 2.4 percent by weight acrylic polymer (polymer): 4.1 percent by weight trimethylolpropane EO-modified (degree of polymerization n=1) triacrylate (photosensitive monomer): 2.8 percent by weight (photosensitive monomer/(photosensitive monomer+ polymer)=2.8/(2.8+4.1)=0.41)

2-methyl-1[4-(methylthio)phenyl]-2-morpholinopropane-1-on: 1.8 percent by weight 2,4-diethylthioxanthone: 0.3 percent by weight 2-benzyl-2-dimethylamino-1-(4-morpholinophenyl)-butanone-1: 1.1 percent by weight ethylcarbitol acetate: 7.5 percent by weight <Formation of Film by Using Photosensitive Paste P05 and Evaluation of Properties>

The photo-curing depth of the resulting photosensitive paste P05 was 7.0 μm at an amount of exposure of 400 mJ/cm². A film having a thickness of 7.0 μm was formed on a PET film through screen printing by using this photosensitive paste P05. Thereafter, the resulting film was cured by application of ultraviolet light under a condition of 400 mJ/cm² through a photomask, and uncured portions were removed with a 0.5 percent by weight sodium carbonate aqueous solution. As a result, the minimum L/S was 30/30 μm.

Subsequently, the pattern disposed on this PET film was turned upside down, and was pressed and transferred to a green sheet by using a thermocompression bonding device under the condition of 60° C., 0.5 MPa, and 60 seconds. The resulting pattern was fired and the width and the thickness of the pattern were observed with a laser microscope. The resulting aspect ratio was 0.33.

A film having a thickness of 25 μm was formed on an alumina substrate by using this photosensitive paste P05 through screen printing, and the resulting film was cured by application of ultraviolet light at 400 mJ/cm². This operation was repeated, so that a paste film having a thickness of 100 μm was formed. The Vickers hardness of this coating film measured 8.1 Hv.

Comparative Example No. 6

Preparation of Photosensitive Paste P06

The following materials were blended and kneaded, so that photosensitive paste P06 containing a polymer outside of the scope of the present invention was prepared.

Cu powder (average particle diameter=2.5 μm): 80 percent by weight acrylic polymer (polymer): 5.6 percent by weight trimethylolpropane EO-modified (degree of polymerization n=1) triacrylate (photosensitive monomer): 3.8 percent by weight (photosensitive monomer/(photosensitive monomer+ polymer)=3.8/(3.8+5.6)=0.40)

2-methyl-1[4-(methylthio)phenyl]-2-morpholinopropane-1-on: 1.0 percent by weight 2,4-diethylthioxanthone: 0.3 percent by weight 2-benzyl-2-dimethylamino-1-(4-morpholinophenyl)-butanone-1: 1.6 percent by weight dipropylene glycol monomethyl ether: 6.9 percent by weight dibutyl phthalate: 0.8 percent by weight <Formation of Film by Using Photosensitive Paste P06 and Evaluation of Properties>

The photo-curing depth of the resulting photosensitive paste P06 was 7.9 μm at an amount of exposure of 400 mJ/cm². A film having a thickness of 7.1 μm was formed on a PET film through screen printing by using this photosensitive paste P06. Thereafter, the resulting film was cured by application of ultraviolet light under a condition of 400 mJ/cm² through a photomask, and uncured portions were removed with a 0.5 percent by weight sodium carbonate aqueous solution. As a result, the minimum L/S was 30/30 μm.

Subsequently, the pattern disposed on this PET film was turned upside down, and was pressed and transferred to a green sheet by using a thermocompression bonding device under the condition of 60° C., 0.5 MPa, and 60 seconds. The resulting pattern was fired and the width and the thickness of the pattern were observed with a laser microscope. The resulting aspect ratio was 0.20.

A film having a thickness of 25 μm was formed on an alumina substrate by using this photosensitive paste P06 through screen printing, and the resulting film was cured by application of ultraviolet light at 400 mJ/cm². This operation was repeated, so that a paste film having a thickness of 100 μm was formed. The Vickers hardness of this coating film measured 12.7 Hv.

Comparative Example No. 7

Preparation of Photosensitive Paste P07

The following materials were blended and kneaded, so that photosensitive paste P07 containing a polymer outside of the scope of the present invention was prepared.

Cu powder (average particle diameter=2.5 μm): 80 percent by weight

Si—B based glass powder (average particle diameter=1.5 μm): 0.4 percent by weight acrylic polymer (polymer): 7.8 percent by weight trimethylolpropane EO-modified (degree of polymerization n=1) triacrylate (photosensitive monomer): 2.8 percent by weight (photosensitive monomer/(photosensitive monomer+ polymer)=2.8/(2.8+7.8)=0.26)

2-methyl-1[4-(methylthio)phenyl]-2-morpholinopropane-1-on: 1.0 percent by weight 2,4-diethylthioxanthone: 0.3 percent by weight 2-benzyl-2-dimethylamino-1-(4-morpholinophenyl)-butanone-1: 0.5 percent by weight dipropylene glycol monomethyl ether: 7.2 percent by weight <Formation of Film by Using Photosensitive Paste P07 and Evaluation of Properties>

The photo-curing depth of the resulting photosensitive paste P07 was 7.0 μm at an amount of exposure of 400 mJ/cm². A film having a thickness of 7.0 μm was formed on an alumina substrate through screen printing by using this photosensitive paste P07. Thereafter, the resulting film was cured by application of ultraviolet light under a condition of 400 mJ/cm² through a photomask, and uncured portions were removed with acetone. As a result, the minimum L/S was 35/30 μm.

The aspect ratio of the pattern was determined from dimensions after firing. The resulting aspect ratio was 0.27.

Subsequently, a film having a thickness of 25 μm was formed on an alumina substrate by using this photosensitive paste P07 through screen printing, and the resulting film was cured by application of ultraviolet light at 400 mJ/cm². This operation was repeated, so that a paste film having a thickness of 100 μm was formed. The Vickers hardness of this coating film measured 10.5 Hv.

Comparative Example No. 8

Preparation of Photosensitive Paste P08

The following materials were blended and kneaded, so that photosensitive paste P08 containing a polymer outside of the scope of the present invention was prepared.

AgPd powder (average particle diameter=2.0 μm): 75 percent by weight acrylic polymer (polymer): 6.8 percent by weight trimethylolpropane EO-modified (degree of polymerization n=1) triacrylate (photosensitive monomer): 4.1 percent by weight (photosensitive monomer/(photosensitive monomer+ polymer)=4.1/(4.1+6.8)=0.38)

2-methyl-1[4-(methylthio)phenyl]-2-morpholinopropane-1-on: 1.5 percent by weight 2,4-diethylthioxanthone: 0.3 percent by weight 2-benzyl-2-dimethylamino-1-(4-morpholinophenyl)-butanone-1: 1.1 percent by weight dipropylene glycol monomethyl ether: 11.2 percent by weight <Formation of Film by Using Photosensitive Paste P08 and Evaluation of Properties>

The photo-curing depth of the resulting photosensitive paste P08 was 6.5 μm at an amount of exposure of 400 mJ/cm². A film having a thickness of 6.5 μm was formed on an alumina substrate through screen printing by using this photosensitive paste P08. Thereafter, the resulting film was cured by application of ultraviolet light under a condition of 400 mJ/cm² through a photomask, and uncured portions were removed with a 0.5 percent by weight sodium carbonate aqueous solution. As a result, the minimum L/S was 25/25 μm.

The aspect ratio of the pattern was determined from dimensions after firing. The resulting aspect ratio was 0.41.

Subsequently, a film having a thickness of 25 μm was formed on an alumina substrate by using this photosensitive paste P08 through screen printing, and the resulting film was cured by application of ultraviolet light at 400 mJ/cm². This operation was repeated, so that a paste film having a thickness of 100 μm was formed. The Vickers hardness of this coating film measured 13.6 Hv.

The conditions, various properties, and the like of Example Nos. 1 to 21 measured as described above are shown in Tables 1 to 5, and the conditions, various properties, and the like of Comparative example Nos. 1 to 8 are shown in Tables 6 and 7.

TABLE 1

| | Example No. | | | |
|---|---|---|---|---|
| | Example No. 1 | Example No. 2 | Example No. 3 | Example No. 4 |
| Paste | P1 | P2 | P3 | P4 |
| Inorganic powder 1 | Ag | Ag | Ag | Ag |
| Inorganic powder 2 | — | — | — | — |
| Inorganic powder 1 particle diameter (μm) | 2.8 | 2.8 | 2.8 | 2.8 |
| Inorganic powder 2 particle diameter (μm) | — | — | — | — |

TABLE 1-continued

| | Example No. | | | |
|---|---|---|---|---|
| | Example No. 1 | Example No. 2 | Example No. 3 | Example No. 4 |
| Inorganic powder content (percent by weight) | 75.0 | 80.0 | 85.0 | 71.0 |
| Photo-curing depth (at 400 mJ/cm²) (μm) | 18.9 | 16.2 | 12.8 | 22.1 |
| Vickers hardness (HV) | 24.6 | 15.2 | 10.6 | 30.2 |
| Resolution (L/S) | 20/20 | 25/25 | 25/25 | 25/20 |
| Aspect ratio after firing | 0.80 | 0.69 | 0.61 | 0.68 |
| Formation object (substrate/film) | alumina | alumina | alumina | alumina |
| Method for forming thick film pattern | screen printing | screen printing | screen printing | screen printing |
| Monomer 1 | A | A | A | A |
| Monomer 2 | — | — | — | B |
| Degree of polymerization of ethylene oxide structure | 0 | 0 | 0 | 1 |
| Double bond concentration of photosensitive monomer (mmol · g⁻¹) | 10.38 | 10.38 | 10.38 | 8.70 |
| Amount of polymer (percent by weight) | 0 | 0 | 0 | 0 |
| Monomer/ (monomer + polymer) | 1.0 | 1.0 | 1.0 | 1.0 |
| Organic solvent | PMG | — | ECA | — |
| Amount of solvent (percent by weight) | 3.0 | 0 | 1.3 | 0 |
| Development solution | ethanol | ethanol | ethanol | acetone |
| Various additives | — | — | — | thixotropic agent |
| Drying step | needless | needless | needless | needless |

TABLE 2

| | Example No. | | | |
|---|---|---|---|---|
| | Example No. 5 | Example No. 6 | Example No. 7 | Example No. 8 |
| Paste | P5 | P6 | P7 | P8 |
| Inorganic powder 1 | Ag | Ag | Ag | Ag and Al₂O₃-coated Ag |
| Inorganic powder 2 | — | — | glass | glass |
| Inorganic powder 1 particle diameter (μm) | 2.8 | 2.8 | 2.8 | 2.8/2.0 |
| Inorganic powder 2 particle diameter (μm) | — | — | 1.5 | 1.5 |
| Inorganic powder content (percent by weight) | 75.0 | 80.0 | 80.0/2.4 | 56.3/18.8/2.4 |
| Photo-curing depth (at 400 mJ/cm²) (μm) | 18.5 | 17.0 | 15.2 | 13.9 |
| Vickers hardness (HV) | 26.5 | 17.1 | 14.8 | 15.4 |
| Resolution (L/S) | 25/25 | 30/30 | 25/30 | 25/30 |
| Aspect ratio after firing | 0.62 | 0.55 | 0.51 | 0.45 |
| Formation object (substrate/film) | alumina | alumina | PET | PET |
| Method for forming thick film pattern | screen printing | screen printing | screen printing | screen printing |
| Monomer 1 | A | A | A | A |
| Monomer 2 | B | B | — | — |
| Degree of polymerization of ethylene oxide structure | 1 | 1 | 0 | 0 |
| Double bond concentration of photosensitive monomer (mmol · g⁻¹) | 8.70 | 8.70 | 10.38 | 10.38 |
| Amount of polymer (percent by weight) | 0 | 0 | 0 | 0 |
| Monomer/ (monomer + polymer) | 1.0 | 1.0 | 1.0 | 1.0 |

TABLE 2-continued

| | Example No. | | | |
|---|---|---|---|---|
| | Example No. 5 | Example No. 6 | Example No. 7 | Example No. 8 |
| Organic solvent | — | PMG | — | DGME |
| Amount of solvent (percent by weight) | 0 | 0.7 | 0 | 1.3 |
| Development solution | acetone | acetone | ethanol | ethanol |
| Various additives | — | — | — | — |
| Drying step | needless | needless | needless | needless |

TABLE 3

| | Example No. | | | |
|---|---|---|---|---|
| | Example No. 9 | Example No. 10 | Example No. 11 | Example No. 12 |
| Paste | P9 | P10 | P11 | P12 |
| Inorganic powder 1 | Cu | Cu | AgPd | Ag |
| Inorganic powder 2 | — | — | — | — |
| Inorganic powder 1 particle diameter (μm) | 2.5 | 2.5 | 2.0 | 3.0 |
| Inorganic powder 2 particle diameter (μm) | — | — | — | — |
| Inorganic powder content (percent by weight) | 77.0 | 80.0 | 80.0 | 75.0 |
| Photo-curing depth (at 400 mJ/cm$^2$) (μm) | 15.8 | 14.8 | 14.1 | 17.1 |
| Vickers hardness (HV) | 17.8 | 16.9 | 15.7 | 27.5 |
| Resolution (L/S) | 30/30 | 25/25 | 20/20 | 30/30 |
| Aspect ratio after firing | 0.59 | 0.53 | 0.7 | 0.61 |
| Formation object (substrate/film) | alumina | alumina | alumina | alumina |
| Method for forming thick film pattern | screen printing | screen printing | screen printing | screen printing |
| Monomer 1 | A | A | A | C |
| Monomer 2 | — | — | — | — |
| Degree of polymerization of ethylene oxide structure | 0 | 0 | 0 | 0 |
| Double bond concentration of photosensitive monomer (mmol·g$^{-1}$) | 10.38 | 10.38 | 10.38 | 10.14 |
| Amount of polymer (percent by weight) | 0 | 0 | 0 | 0 |
| Monomer/(monomer + polymer) | 1.0 | 1.0 | 1.0 | 1.0 |
| Organic solvent | DGME/PMG | — | — | — |
| Amount of solvent (percent by weight) | 6.0 | 0 | 0 | 0 |
| Development solution | ethanol | ethanol | ethanol | ethanol |
| Various additives | — | DBP | — | thixotropic agent |
| Drying step | need | needless | needless | needless |

TABLE 4

| | Example No. | | | |
|---|---|---|---|---|
| | Example No. 13 | Example No. 14 | Example No. 15 | Example No. 16 |
| Paste | P13 | P14 | P15 | P16 |
| Inorganic powder 1 | Ag | Ag | Ag | Ag |
| Inorganic powder 2 | — | — | — | — |
| Inorganic powder 1 particle diameter (μm) | 2.8 | 2.8 | 2.8 | 2.8 |
| Inorganic powder 2 particle diameter (μm) | — | — | — | — |
| Inorganic powder content (percent by weight) | 75.0 | 75.0 | 75.0 | 75.0 |
| Photo-curing depth (at 400 mJ/cm$^2$) (μm) | 16.7 | 16.0 | 15.6 | 14.2 |
| Vickers hardness (HV) | 19.9 | 18.5 | 18.4 | 18.0 |
| Resolution (L/S) | 25/25 | 25/25 | 25/25 | 30/25 |
| Aspect ratio after firing | 0.68 | 0.62 | 0.60 | 0.48 |
| Formation object (substrate/film) | alumina | alumina | alumina | alumina |
| Method for forming thick film pattern | screen printing | screen printing | screen printing | screen printing |
| Monomer 1 | B | A | A | A |
| Monomer 2 | — | — | — | — |
| Degree of polymerization of ethylene oxide structure | 1 | 0 | 0 | 0 |
| Double bond concentration of photosensitive monomer (mmol·g$^{-1}$) | 10.38 | 10.38 | 10.38 | 10.38 |
| Amount of polymer (percent by weight) | 0.5 | 1.0 | 1.0 | 2.0 |
| Monomer/(monomer + polymer) | 0.97 | 0.95 | 0.90 | 0.86 |
| Organic solvent | DGME | DGME | DGME | DGME |
| Amount of solvent (percent by weight) | 5.0 | 1.0 | 4.0 | 3.8 |
| Development solution | ethanol | ethanol | ethanol | ethanol |
| Various additives | thixotropic agent | — | thixotropic agent | thixotropic agent |
| Drying step | needless | needless | needless | needless |

TABLE 5

| | Example No. | | | | |
|---|---|---|---|---|---|
| | Example No. 17 | Example No. 18 | Example No. 19 | Example No. 20 | Example No. 21 |
| Paste | P17 | P18 | P19 | P20 | P21 |
| Inorganic powder 1 | Ag | Ag | Ag | Ag | Ag |
| Inorganic powder 2 | — | — | — | — | — |
| Inorganic powder 1 particle diameter (μm) | 3.0 | 3.0 | 3.0 | 3.0 | 2.8 |
| Inorganic powder 2 particle diameter (μm) | — | — | — | — | — |
| Inorganic powder content (percent by weight) | 75.0 | 75.0 | 75.0 | 75.0 | 80.0 |
| Photo-curing depth (at 400 mJ/cm$^2$) (μm) | 12.5 | 13.8 | 11.3 | 11.0 | 15.5 |
| Vickers hardness (HV) | 15.8 | 14.3 | 13.2 | 13.1 | 15.1 |
| Resolution (L/S) | 30/25 | 35/35 | 35/30 | 40/30 | 25/20 |

TABLE 5-continued

| | Example No. 17 | Example No. 18 | Example No. 19 | Example No. 20 | Example No. 21 |
|---|---|---|---|---|---|
| Aspect ratio after firing | 0.55 | 0.35 | 0.30 | 0.29 | 0.65 |
| Formation object (substrate/film) | alumina | alumina | alumina | alumina | alumina |
| Method for forming thick film pattern | screen printing | screen printing | screen printing | screen printing | screen printing |
| Monomer 1 | B | D | B | B | A |
| Monomer 2 | — | — | — | — | — |
| Degree of polymerization of ethylene oxide structure | 1 | 0 | 3 | 4 | 0 |
| Double bond concentration of photosensitive monomer (mmol·g$^{-1}$) | 7.01 | 12.05 | 4.34 | 3.64 | 10.38 |
| Amount of polymer (percent by weight) | 0 | 0 | 0 | 0 | 0 |
| Monomer/ (monomer + polymer) | 1.0 | 1.0 | 1.0 | 1.0 | 1.0 |
| Organic solvent | — | — | — | — | — |
| Amount of solvent (percent by weight) | 0 | 0 | 0 | 0 | 0 |
| Development solution | ethanol | ethanol | ethanol | ethanol | ethanol |
| Various additives | thixotropic agent | thixotropic agent | thixotropic agent | thixotropic agent | ultraviolet absorber |
| Drying step | needless | needless | needless | needless | needless |

TABLE 6

| | Comparative example No. 1 | Comparative example No. 2 | Comparative example No. 3 | Comparative example No. 4 |
|---|---|---|---|---|
| Paste | P01 | P02 | P03 | P04 |
| Inorganic powder 1 | Ag | Ag | Ag | Ag |
| Inorganic powder 2 | — | — | — | — |
| Inorganic powder 1 particle diameter (μm) | 2.8 | 2.8 | 2.8 | 2.8 |
| Inorganic powder 2 particle diameter (μm) | — | — | — | — |
| Inorganic powder content (percent by weight) | 75.0 | 75.0 | 74.0 | 77.0 |
| Photo-curing depth (at 400 mJ/cm$^2$) (μm) | 9.6 | 6.7 | 9.1 | 7.2 |
| Vickers hardness (HV) | 17.3 | 15.4 | 18.8 | 12.7 |
| Resolution (L/S) | 30/30 | 30/30 | 25/25 | 30/25 |
| Aspect ratio after firing | 0.32 | 0.27 | 0.43 | 0.31 |
| Formation object (substrate/film) | alumina | alumina | alumina | alumina |
| Method for forming thick film pattern | screen printing | screen printing | screen printing | screen printing |
| Monomer 1 | A | A | B | B |
| Monomer 2 | — | — | — | — |
| Degree of polymerization of ethylene oxide structure | 0 | 0 | 1 | 1 |
| Double bond concentration of photosensitive monomer (mmol·g$^{-1}$) | 10.38 | 10.38 | 7.01 | 7.01 |
| Amount of polymer (percent by weight) | 3.0 | 4.0 | 6.2 | 5.5 |
| Monomer/ (monomer + polymer) | 0.81 | 0.74 | 0.49 | 0.53 |
| Organic solvent | DGME | DGME | DGME | PMG/DGME |
| Amount of solvent (percent by weight) | 2.0 | 3.5 | 11.6 | 1.2/8.5 |
| Development solution | ethanol | sodium carbonate | sodium carbonate | sodium carbonate |
| Various additives | thixotropic agent | thixotropic agent | thixotropic agent | — |
| Drying step | needless | needless | need | need |

TABLE 7

| | Comparative example No. 5 | Comparative example No. 6 | Comparative example No. 7 | Comparative example No. 8 |
|---|---|---|---|---|
| Paste | P05 | P06 | P07 | P08 |
| Inorganic powder 1 | Ag | Cu | Cu | AgPd |
| Inorganic powder 2 | glass powder | — | glass powder | — |
| Inorganic powder 1 particle diameter (μm) | 2.8 | 2.5 | 2.5 | 2.0 |
| Inorganic powder 2 particle diameter (μm) | 1.5 | — | 1.5 | — |
| Inorganic powder content (percent by weight) | 80.0/2.4 | 80.0 | 80.0/0.4 | 75.0 |
| Photo-curing depth (at 400 mJ/cm$^2$) (μm) | 7.0 | 7.9 | 7.0 | 6.5 |
| Vickers hardness (HV) | 8.1 | 12.7 | 10.5 | 13.6 |

TABLE 7-continued

| | Example No. | | | |
|---|---|---|---|---|
| | Comparative example No. 5 | Comparative example No. 6 | Comparative example No. 7 | Comparative example No. 8 |
| Resolution (L/S) | 30/30 | 30/30 | 35/30 | 25/25 |
| Aspect ratio after firing | 0.33 | 0.20 | 0.27 | 0.41 |
| Formation object (substrate/film) | PET | PET | alumina | alumina |
| Method for forming thick film pattern | screen printing | screen printing | screen printing | screen printing |
| Monomer 1 | B | B | B | B |
| Monomer 2 | — | — | — | — |
| Degree of polymerization of ethylene oxide structure | 1 | 1 | 1 | 1 |
| Double bond concentration of photosensitive monomer $(mmol \cdot g^{-1})$ | 7.01 | 7.01 | 7.01 | 7.01 |
| Amount of polymer (percent by weight) | 4.1 | 5.6 | 7.8 | 6.8 |
| Monomer/ (monomer + polymer) | 0.41 | 0.40 | 0.26 | 0.38 |
| Organic solvent | ECA | DGME | DGME | DGME |
| Amount of solvent (percent by weight) | 7.5 | 6.9 | 7.2 | 11.2 |
| Development solution | sodium carbonate | sodium carbonate | acetone | sodium carbonate |
| Various additives | — | DBP | — | — |
| Drying step | need | need | need | need |

In Tables 1 to 7, monomer A, monomer B, monomer C, monomer D, PMG, ECA, DGME, DBP, and polymer denote the following respective substances.

monomer A: dipentaerythritol hexaacrylate
monomer B: trimethylolpropane EO-modified triacrylate
monomer C: trimethylolpropane triacrylate
monomer D: triallyl isocyanurate
PMG: pentamethylene glycol
ECA: ethylcarbitol acetate
DGME: dipropylene glycol monomethyl ether
DBP: dibutyl phthalate
polymer: methacrylic acid-methyl methacrylate copolymer molecular weight Mw=15,000

As is clear from the above-described Example Nos. 1 to 21 and Comparative Example Nos. 1 to 8, the photosensitive paste containing no polymer and the photosensitive paste containing a polymer within the scope of the present invention exhibit photo-curing depths of about 10 μm or more, and thick film patterns having large thicknesses and exhibiting high dimension precision and high shape precision can be formed efficiently by using the photosensitive pastes within the scope of the present invention, although the photosensitive pastes of Comparative Example Nos. 1 to 8 containing a polymer outside of the scope of the present invention exhibit photo-curing depths of less than 10 μm, so that a pattern having an adequate thickness cannot be formed by using such a photosensitive paste.

In each of the above-described Examples and Comparative examples, the exposure treatment is conducted through the photomask. However, it is also possible to apply laser light or UV light with a wavelength of about 300 nm to about 420 nm to a photosensitive paste film by using Maskless Exposure System (produced by Ball semiconductor Inc., for example), so as to cure the photosensitive paste film. In that case, a desired pattern can be formed by moving a stage indicating the photosensitive paste film in accordance with the pattern information input beforehand.

Figure 3:
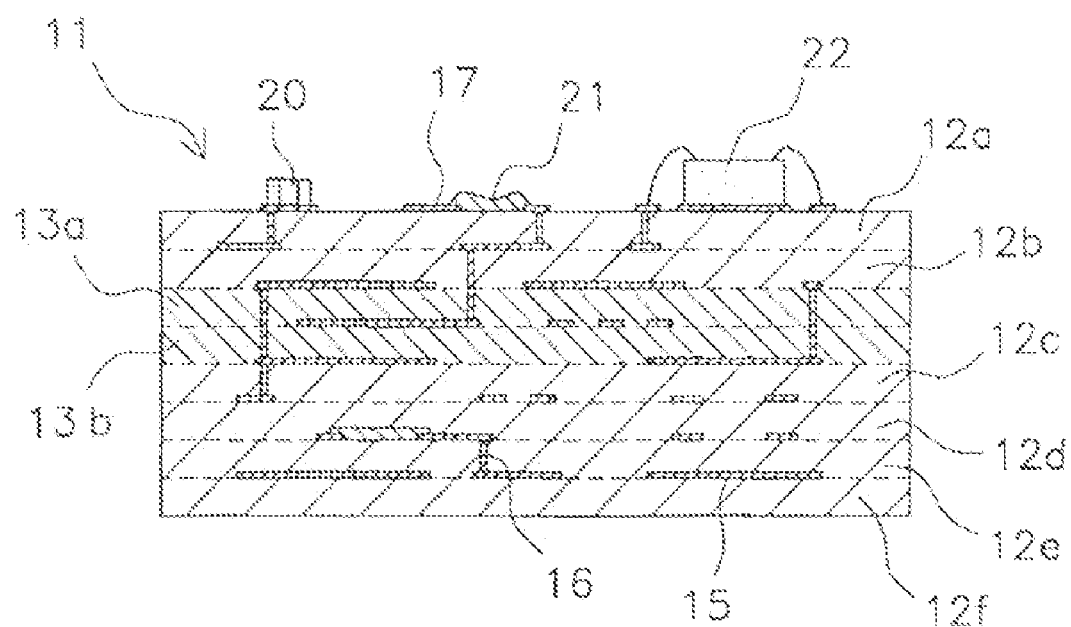
FIG. 3 is a sectional view showing an electronic component (ceramic multilayer substrate) according to another preferred embodiment of the present invention.

FIG. 3 is a sectional view showing an electronic component (ceramic multilayer substrate) according to another preferred embodiment of the present invention. This ceramic multilayer substrate is preferably a ceramic multilayer substrate provided with electrodes (inner layer copper pattern, surface layer copper pattern, and the like) composed of thick film patterns formed by using the photosensitive paste (photosensitive copper paste) of various preferred embodiments of the present invention.

A ceramic multilayer substrate 11 in the present preferred embodiment is preferably formed by laminating insulator layers 12a, 12b, 12c, 12d, 12e, and 12f and dielectric layers 13a and 13b. In the inside thereof, capacitor patterns, coil patterns, strip lines, and the like are formed from inner layer copper patterns 15 and via holes 16.

Furthermore, a chip component 20, e.g., a chip capacitor, a thick film resistor 21, a semiconductor IC 22, and the like are disposed on one main surface of the ceramic multilayer substrate 11, and are connected to their respective surface layer copper patterns 17 or inner layer copper patterns 15.

In this ceramic multilayer substrate 11, the inner layer copper patterns (thick film patterns) 15 and surface layer copper patterns (thick film patterns) 17 have widths of about 50 μm and film thicknesses of about 5 μm or more.

A method for manufacturing this ceramic multilayer substrate 11 will be described below.

A glass powder, a ceramic powder, and an organic vehicle are mixed, so that an insulator ceramic green sheet slurry is prepared. Likewise, a dielectric ceramic green sheet slurry is prepared. Each of the resulting slurries is molded into the shape of a sheet by a doctor blade method or the like, and is dried at a temperature of about 50° C. to about 150° C., so that insulator ceramic green sheets and dielectric ceramic green sheets are produced. The ceramic green sheets are provided with their respective via holes as needed.

A photosensitive paste (photosensitive copper paste) according to a preferred embodiment of the present invention, the paste having a predetermined photo-curing depth, is prepared. The photosensitive copper paste is applied to a support to form a photosensitive copper paste film. The film thickness of the photosensitive copper paste film is set in consideration of the photo-curing depth.

This photosensitive copper paste film is subjected to an exposure treatment and, thereafter, is developed, so that a thick film pattern having a predetermined shape is formed on the support.

The thick film pattern formed on the support is transferred to the ceramic green sheet (insulator ceramic green sheet or dielectric ceramic green sheet (an object to which the transfer is conducted)) produced as described above, so that a capacitor pattern, a coil pattern, or the like is formed.

The ceramic green sheets provided with thick film patterns are stacked, press-bonded and, thereafter, fired at a predetermined temperature. Subsequently, chip components, semiconductor ICs, and the like are mounted, thick film resistors are printed and, thereby, the ceramic multilayer substrate 11 as shown in FIG. 3 is formed.

In the production of this ceramic multilayer substrate 11, since the thick film patterns (inner layer copper patterns, surface layer copper patterns, and the like) are formed by the method for forming a thick film pattern according to various preferred embodiments of the present invention, it becomes possible to form a highly precise, fine thick film pattern having a large film thickness on a ceramic green sheet by a transfer method. Consequently, a ceramic multilayer substrate satisfactorily suitable for an increase in signal speed and an increase in wiring density can be produced efficiently by stacking and press-bonding ceramic green sheets provided with the above-described thick film patterns and, thereafter, firing them at a predetermined temperature.

In the above-described present preferred embodiment, the ceramic multilayer substrate is preferably shown as the electronic component. However, the present invention can be applied to circuit substrates, which are not multilayered, and other various electronic components.

Figure 4:
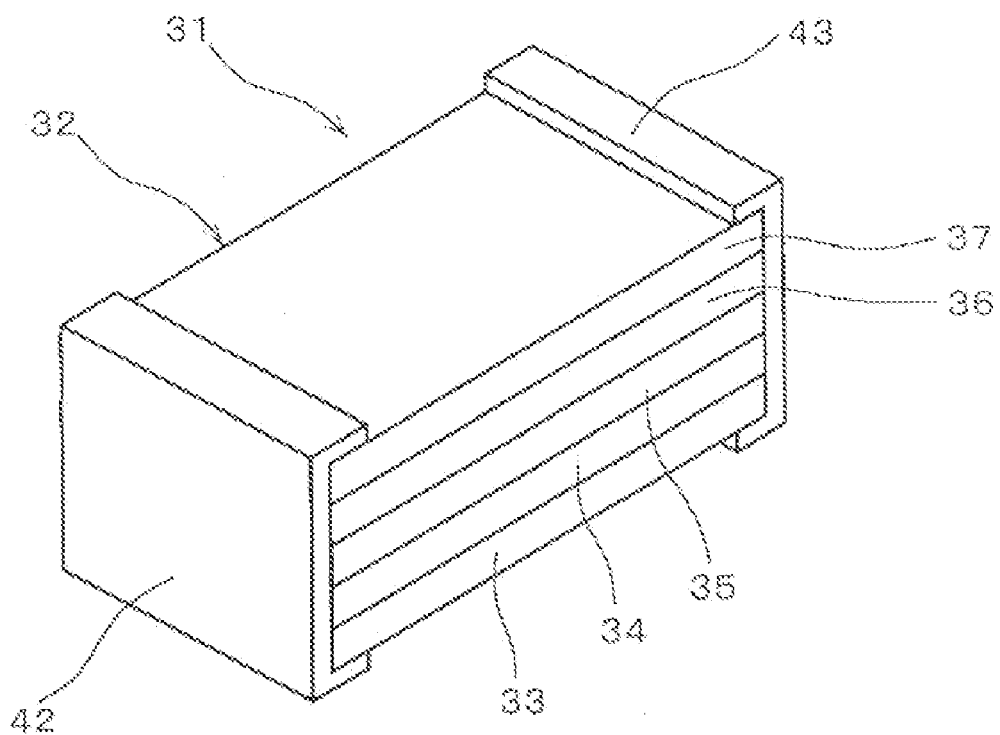
FIG. 4 is a perspective view showing an appearance of a chip coil according to another preferred embodiment of the present invention.
Figure 5:
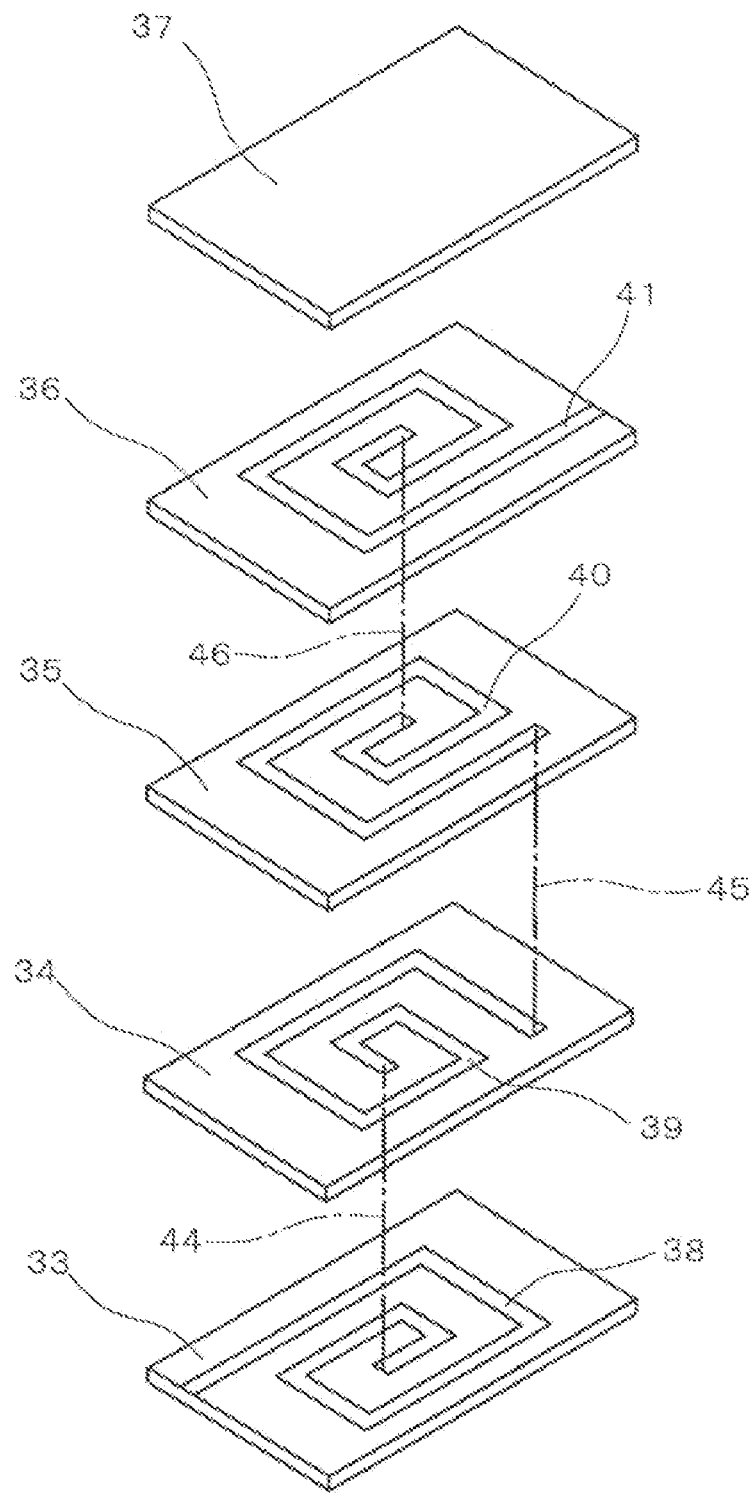
FIG. 5 is a perspective exploded view showing a configuration of the chip coil shown in FIG. 4.

FIG. 4 and FIG. 5 are drawings showing another example of electronic components according to a further preferred embodiment of the present invention.

FIG. 4 is a perspective view showing an appearance of a chip coil 31 as an example of the above-described electronic components. FIG. 5 is a perspective exploded view showing a component body 32 of the chip coil 31 shown in FIG. 4.

The chip coil 31 is provided with an insulating substrate 33, and insulator films 34, 35, 36, and 37 disposed by using a photolithography photosensitive paste (insulator photosensitive paste) according to a preferred embodiment of the present invention are laminated sequentially on this insulating substrate 33. Furthermore, conductor films 38, 39, 40, and 41 disposed by using a photolithography photosensitive paste (conductor photosensitive paste) according to a preferred embodiment of the present invention are located on the insulating substrate 33 and the insulator films 34, 35, and 36, respectively.

The component main body 32 preferably includes the insulating substrate 33, insulator films 34 to 37, and conductor films 38 to 41. External terminals 42 and 43 are disposed on opposed two end surfaces of the component body 32.

The conductor films 38 to 41 are connected to each other through via hole connection portions 44 to 46 arranged to penetrate the insulator films 34 to 36, respectively, so as to form a predetermined coil pattern as a whole. In FIG. 5, the location of each of the via hole connection portions 44 to 46 is simply indicated by an alternate long and short dashed lines, and individual penetration conductors constituting via hole connection portions 44 to 46 are not shown in the drawing.

In more detail, the conductor film 38 is electrically connected to the conductor film 39 through the via hole connection portion 44 disposed in the insulator film 34. Likewise, the conductor film 39 is electrically connected to the conductor film 40 through the via hole connection portion 45 disposed in the insulator film 35. The conductor film 40 is electrically connected to the conductor film 41 through the via hole connection portion 46 disposed in the insulator film 36. The two end portions of the conductor films 38 to 41 connected to each other to form the coil pattern, as described above, that is, one end portion of the conductor film 38 and one end portion of the conductor film 41, are electrically connected to the external terminals 42 and 43, respectively.

A method for manufacturing this chip coil 31 will be described below.

As shown in FIG. 5, a photolithography photosensitive paste (conductor photosensitive paste) according to a preferred embodiment of the present invention is applied to the insulating substrate 33 formed from, for example, alumina. For the application of this photolithography photosensitive paste (conductor photosensitive paste), various methods, e.g., a screen printing method, a spin coating method, and a doctor blade method, can be used.

The photosensitive paste film (conductor paste film) applied and formed as described above is dried and, thereafter, is subjected to an exposure treatment through a photomask having a predetermined pattern.

A development treatment is conducted to remove unnecessary portions of the photosensitive paste film (conductor paste film). Thereafter, for example, a spiral conductor film 38 is formed by conducting a firing treatment in air under a predetermined condition.

The photolithography photosensitive paste (insulator photosensitive paste) according to a preferred embodiment of the present invention is applied to the insulating substrate 33 while covering the conductor film 38. A method similar to that in the above-described case of application of the conductor photosensitive paste can be used for this coating.

The photosensitive paste film (insulator paste film) formed as described above is dried. Subsequently, the resulting photosensitive paste film (insulator paste film) is subjected to an exposure treatment through a photomask having a predetermined pattern in order to form a hole having a diameter of, for example, about 50 μm (not shown in the drawing) and being used for a via hole connection portion 44.

A development treatment is conducted to remove unnecessary portions. Thereafter, for example, an insulator film 34 having a hole for the via hole connection portion 44 is formed by conducting a firing treatment in air under a predetermined condition.

A conductor paste is filled in the above-described hole for the via hole connection portion 44, and drying is conducted, so that the via hole connection portion 44 is formed in the insulator film 34.

A spiral conductor film 39 is formed on the insulator film 34 by a method similar to that in the above-described case of formation of the conductor film 38.

Alternatively, the hole of the via hole connection portion may be filled in with the conductor paste and the photosensitive paste film (conductor paste film) may be formed by applying the conductor paste once, followed by exposure and development. Thereafter, the via hole conductor and the conductor film may be fired simultaneously.

Subsequently, the insulator film 35, the conductor film 40, the insulator film 36, and the conductor film 41 are formed sequentially by a method similar to that described above. After the insulator film 37 used for protection is formed, the external terminals 42 and 43 are formed, so that the chip coil 31 exhibiting an appearance as shown in FIG. 4 is completed.

According to the above-described manufacturing method, the photolithography photosensitive paste (insulator photosensitive paste) of a preferred embodiment of the present invention is used for forming the insulator films 34 to 37. Therefore, in particular, fine holes for the via hole connection portions 44 to 46 to be disposed in the insulator films 34 to 36 can simply and easily be formed with excellent precision with respect to the shape and the location.

Likewise, since the conductor films 38 to 41 are formed by using the photosensitive paste (conductor photosensitive paste) of a preferred embodiment of the present invention, fine and high-density patterns can simply and easily be provided to these conductor films 38 to 41 with high precision. In particular, thick conductor films 38 to 41 can easily be formed as compared with those in the case where a usual screen printing method or the like is applied. Consequently, the chip coil 31 is allowed to have excellent high-frequency properties.

It is also possible to use the photosensitive paste according to various preferred embodiments of the present invention for only one of the conductor photosensitive paste and the insulator photosensitive paste.

The present invention is not limited to the above-described embodiments, and various applications and modifications can be made within the scope of the invention.

According to various preferred embodiments of the present invention, it is possible to efficiently form via photolithography a thick film pattern having a large thickness and exhibiting high dimension precision and high shape precision and, by extension, it becomes possible to produce high-performance, highly reliable ceramic multilayer substrates, chip coil components, and the like, efficiently.

Therefore, the present invention can be widely applied to various electronic components and methods for manufacturing them.

The invention claimed is:

1. A method for forming a thick film pattern, comprising the steps of:
   applying to a support a photosensitive paste including a conductive powder, a photosensitive monomer, a photopolymerization initiator, and a polymer, wherein a ratio of the photosensitive monomer to a total amount of the photosensitive monomer and the polymer satisfies the condition represented by the following Formula:
   photosensitive monomer/(photosensitive monomer+polymer)≧0.90,
   so as to form a photosensitive paste film;
   subjecting the photosensitive paste film to an exposure treatment; and
   developing the photosensitive paste film subjected to the exposure treatment so as to form a thick film pattern; wherein
   the contents of the conductive powder, the photosensitive monomer, and the photopolymerization initiator are within the following ranges:
   conductive powder: about 60 to about 90 percent by weight of the photosensitive paste;
   photosensitive monomer: about 5 to about 39 percent by weight of the photosensitive paste;
   photopolymerization initiator: about 1 to about 10 percent by weight of the photosensitive paste; and
   the photosensetive paste includes a photosensitive monomer having a double bond concentration within the range of about 8 mmol/g to about 11 mmol/g.

2. The method for forming a thick film pattern according to claim 1, wherein the photosensitive paste includes a photosensitive monomer having an ethylene oxide structure with a degree of polymerization of about 3 or less.

3. The method for forming a thick film pattern according to claim 1, wherein the photosensitive paste comprises an ultraviolet absorber.

4. The method for forming a thick film pattern according to claim 1, wherein the photosensitive paste comprises a solvent in a proportion of about 5 percent by weight or less.

5. The method for forming a thick film pattern according to claim 1, wherein the developing is conducted by using an organic solvent in the developing step.

6. The method for forming a thick film pattern according to claim 1, wherein the exposure treatment is conducted while the photosensitive paste film and a photomask are arranged to be kept from contacting with each other in the exposure step.

7. The method for forming a thick film pattern according to claim 1, wherein the photosensitive paste is subjected to the exposure treatment without using a photomask in the exposure step.

8. A method for manufacturing an electronic component, comprising the steps of:
   a thick film pattern by the method according to claim 1; and
   firing the resulting thick film pattern.

* * * * *